United States Patent
Wang et al.

(10) Patent No.: US 12,265,293 B2
(45) Date of Patent: Apr. 1, 2025

(54) DISPLAY PANEL AND PREPARATION METHOD THEREFOR, AND DISPLAY DEVICE

(71) Applicants: Beijing BOE Technology Development Co., Ltd, Beijing (CN); BOE Technology Group Co., Ltd., Beijing (CN)

(72) Inventors: Long Wang, Beijing (CN); Yidan Peng, Beijing (CN); Tuo Sun, Beijing (CN); Kui Liang, Beijing (CN); Liye Duan, Beijing (CN); Guangkui Qin, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/778,864

(22) PCT Filed: Jun. 15, 2021

(86) PCT No.: PCT/CN2021/100142
§ 371 (c)(1),
(2) Date: May 23, 2022

(87) PCT Pub. No.: WO2022/261826
PCT Pub. Date: Dec. 22, 2022

(65) Prior Publication Data
US 2024/0168325 A1    May 23, 2024

(51) Int. Cl.
*G02F 1/1335* (2006.01)
*G02F 1/1343* (2006.01)
(Continued)

(52) U.S. Cl.
CPC .. *G02F 1/133512* (2013.01); *G02F 1/134345* (2021.01); *G02F 1/1368* (2013.01);
(Continued)

(58) Field of Classification Search
CPC ........... G02F 1/133512; G02F 1/13775; G02F 1/134345; G02F 1/1368
(Continued)

(56) References Cited

U.S. PATENT DOCUMENTS 9,036,106 B2 * 5/2015 Zi ..................... G02F 1/136209
                                                        349/110
2006/0092351 A1   5/2006 Kim et al.
(Continued)

FOREIGN PATENT DOCUMENTS

CN         1624532 A    6/2005
CN       103094312 A    5/2013
(Continued)

OTHER PUBLICATIONS

Office Action dated Jun. 28, 2024 for Chinese Patent Application No. 202180001536.3 and English Translation.

*Primary Examiner* — Dung T Nguyen
*Assistant Examiner* — David Y Chung
(74) *Attorney, Agent, or Firm* — Ling Wu; Stephen Yang; Ling and Yang Intellectual Property

(57) ABSTRACT

A display panel and a preparation method therefor, and a display device are provided. The display panel includes first and second substrates oppositely provided, and a polymer-stabilized liquid crystal layer; multiple sub-pixels include at least one first sub-pixel emitting light from a side of the second substrate away from the first substrate and at least one second sub-pixel emitting light from a side of the first substrate away from the second substrate; the first substrate in a first sub-pixel has a first shielding pattern, and an
(Continued)

orthographic projection of the pixel electrode therein on a display panel plane is within that of the first shielding pattern on the first substrate; the second substrate in a second sub-pixel has a second shielding pattern, and an orthographic projection of the pixel electrode therein on the display panel plane is within that of the second shielding pattern on the second substrate.

16 Claims, 13 Drawing Sheets

(51) Int. Cl.
*G02F 1/1368* (2006.01)
*G02F 1/137* (2006.01)
*H01L 27/12* (2006.01)

(52) U.S. Cl.
CPC ........ *G02F 1/13775* (2021.01); *H01L 27/124* (2013.01); *G02F 2203/01* (2013.01)

(58) Field of Classification Search
USPC .............................................. 349/42, 43, 110
See application file for complete search history.

(56) References Cited

U.S. PATENT DOCUMENTS

| | | | |
|---|---|---|---|
| 2007/0121035 A1 | 5/2007 | Lee et al. | |
| 2008/0002429 A1* | 1/2008 | Noba | G02B 6/0016 |
| | | | 362/612 |
| 2008/0036953 A1* | 2/2008 | Otake | G02F 1/133555 |
| | | | 349/114 |
| 2013/0148069 A1* | 6/2013 | Archetti | C09K 19/52 |
| | | | 349/139 |
| 2014/0197388 A1 | 7/2014 | Zhang | |
| 2016/0124254 A1* | 5/2016 | Yoon | G02F 1/1309 |
| | | | 349/110 |
| 2016/0342282 A1 | 11/2016 | Wassvik | |
| 2018/0373075 A1 | 12/2018 | Cheng et al. | |
| 2020/0058625 A1 | 2/2020 | Chen et al. | |

FOREIGN PATENT DOCUMENTS

| | | |
|---|---|---|
| CN | 104020604 A | 9/2014 |
| CN | 104134683 A | 11/2014 |
| CN | 105938280 A | 9/2016 |
| CN | 106444200 A | 2/2017 |
| CN | 110262115 A | 9/2019 |
| CN | 112578585 A | 3/2021 |
| CN | 112687724 A | 4/2021 |
| CN | 113156682 A | 7/2021 |

\* cited by examiner

DISPLAY PANEL AND PREPARATION METHOD THEREFOR, AND DISPLAY DEVICE

CROSS-REFERENCE TO RELATED APPLICATION

The present disclosure is a U.S. National Phase Entry of International Application PCT/CN2021/100142 having an international filing date of Jun. 15, 2021, and the contents disclosed in the above-mentioned application are hereby incorporated as a part of this application.

TECHNICAL FIELD

The present disclosure relates to, but is not limited to the field of display technology, in particular to a display panel and a method for preparing the display panel, and a display device.

BACKGROUND

Liquid Crystal Display (LCD) has advantages such as small size, low power consumption and no radiation, and has developed rapidly. A main structure of an LCD includes a Thin Film Transistor (TFT) array substrate and a Color Filter (CF) substrate that are cell-aligned, and Liquid Crystal (LC) molecules are provided between the array substrate and the color filter substrate. By controlling a common electrode and a pixel electrode, an electric field is formed to drive the liquid crystal to deflect, thereby implementing gray scale display.

With maturity of liquid crystal display technology, the liquid crystal display technology is increasingly applied in transparent display. Transparent display is an important personalized display field of display technology, which means that a picture is displayed by a device in a transparent state, and the viewer can not only see the image in the display device, but also see a background behind the display device. Transparent display may include single-sided transparent display and double-sided transparent display. The double-sided transparent display may be widely used in transparent show windows, display walls, traffic signs, transparent vehicle display and so on, which has a good prospect.

SUMMARY

The following is a summary of subject matters described herein in detail. The summary is not intended to limit the protection scope of claims.

In one aspect, the present disclosure provides a display panel including a first substrate and a second substrate provided opposite each other, and a polymer-stabilized liquid crystal layer provided between the first substrate and the second substrate; wherein the first substrate includes multiple sub-pixels defined by intersection of multiple gate lines and multiple data lines, and each of the multiple sub-pixels includes a thin film transistor and a pixel electrode; the multiple sub-pixels include at least one first sub-pixel that emits light from a side of the second substrate away from the first substrate and at least one second sub-pixel that emits light from a side of the first substrate away from the second substrate; the first substrate in a first sub-pixel is provided with a first shielding pattern, and an orthographic projection of the pixel electrode in the first sub-pixel on a plane of the display panel is within a range of an orthographic projection of the first shielding pattern on the first substrate; the second substrate in a second sub-pixel is provided with a second shielding pattern, and an orthographic projection of the pixel electrode in the second sub-pixel on the plane of the display panel is within a range of an orthographic projection of the second shielding pattern on the second substrate.

In an exemplary embodiment, the first substrate and/or the second substrate are further provided with a shielding strip, and an orthographic projection of the shielding strip on the plane of the display panel at least partially overlaps with an orthographic projection of the gate lines and/or the data lines on the plane of the display panel.

In an exemplary embodiment, the first substrate and/or the second substrate are further provided with a shielding strip, and an extension direction of the shielding strip is perpendicular to a light propagation direction in the display panel.

In an exemplary embodiment, the first substrate and/or the second substrate are further provided with a shielding block, and an orthographic projection of the shielding block on the plane of the display panel at least partially overlaps with an orthographic projection of the thin film transistor on the plane of the display panel.

In an exemplary embodiment, a common electrode is provided on the second substrate; in the first sub-pixel, there is a first overlapping area between an orthographic projection of the pixel electrode of the first substrate on the plane of the display panel and an orthographic projection of the common electrode of the second substrate on the display panel plane, the first overlapping area forms a first display area in which light is emitted from the side of the second substrate away from the first substrate, and an area other than the first display area forms a first transparent area; in the second sub-pixel, there is a second overlapping area between an orthographic projection of the pixel electrode of the first substrate on the display panel plane and an orthographic projection of the common electrode of the second substrate on the plane of the display panel, the second overlapping area forms a second display area in which light is emitted from the side of the first substrate away from the second substrate, and an area other than the second display area forms a second transparent area.

In an exemplary embodiment, the common electrode is provided with a first opening and/or a second opening, an orthographic projection of the first opening in the plane of the display panel at least partially overlaps with an orthographic projection of the thin film transistor on the plane of the display panel, and an orthographic projection of the second opening on the plane of the display panel at least partially overlaps with an orthographic projection of the gate lines and/or the data lines on the plane of the display panel.

In an exemplary embodiment, a shape of the pixel electrodes includes any one or more of block, strip and grid.

In an exemplary embodiment, the pixel electrode includes at least one first electrode strip extending along a first direction and at least one second electrode strip extending along a second direction, the at least one first electrode strip and the at least one second electrode strip intersect with each other to form a grid-shaped pixel electrode, and the second direction intersects with the first direction.

In an exemplary embodiment, an area of the pixel electrode is 30% to 50% of an area of a pixel opening of the sub-pixel.

In an exemplary embodiment, a length of a first electrode strip in the first direction is 50% to 70% of a length of the pixel opening in the first direction, and/or a length of a second electrode strip in the second direction is 50% to 70% of a length of the pixel opening in the second direction.

In an exemplary embodiment, the first shielding pattern and the second shielding pattern include at least one first shielding strip extending along the first direction and at least one second shielding strip extending along the second direction, the first shielding strip and the second shielding strip intersect with each other to form a grid shape; a width of a first shielding strip in the first direction is greater than a width of a first electrode strip in the first direction, and an orthographic projection of the first electrode strip on the plane of the display panel is within a range of an orthographic projection of the first shielding strip on the plane of the display panel; a width of a second shielding strip in the second direction is greater than a width of a second electrode strip in the second direction, and an orthographic projection of the second electrode strip on the plane of the display panel is within a range of an orthographic projection of the second shielding strip on the plane of the display panel.

In an exemplary embodiment, in the first direction, the width of the first shielding strip≥ the width of the first electrode strip+2*lithography platform alignment accuracy+cell alignment platform accuracy+safe distance; and in the second direction, the width of the second shielding strip≥the width of the second electrode strip+2*lithography platform alignment accuracy+cell alignment platform accuracy+safe distance.

In an exemplary embodiment, the first substrate includes: a first base substrate, an array structural layer provided on a side of the first base substrate adjacent to a second base substrate, a first shielding pattern provided on a side of the array structural layer close to the second base substrate, an insulating layer provided on a side of the first shielding pattern close to the second base substrate, and a pixel electrode provided on a side of the insulating layer close to the second base substrate, wherein the first shielding pattern is provided on a first sub-pixel. The second substrate includes: a second base substrate, a second shielding pattern provided on a side of the second base substrate close to the first base substrate, a protective layer provided on a side of the second shielding pattern close to the first base substrate, and a common electrode provided on a side of the protective layer close to the first base substrate, wherein the second shielding pattern is provided on a second sub-pixel.

In an exemplary embodiment, the display panel further includes a light source device, wherein the light source device is provided on the side of the first substrate away from the second substrate, or the light source device is provided on the side of the second substrate away from the first substrate, or the light source device is provided on a side surface of the first substrate, or the light source device is provided on a side surface of the second substrate.

In an exemplary embodiment, the light source device includes a first light source emitting light of a first color, a second light source emitting light of a second color, and a third light source emitting light of a third color, and the light of the first color, the light of the second color, and the light of the third color are periodically emitted in sequence.

In an exemplary embodiment, the light source device further includes a light guide plate, wherein the light guide plate is provided on the side of the first substrate away from the second substrate, or the light guide plate is provided on the side of the second substrate away from the first substrate; and the first light source, the second light source and the third light source are provided on a side surface of the light guide plate.

In another aspect, the present disclosure provides a display device, including the aforementioned display panel.

In another aspect, the present disclosure provides a method for preparing a display panel, including:
preparing a first substrate and a second substrate; wherein the first substrate includes multiple sub-pixels defined by intersection of multiple gate lines and multiple data lines, and each of the multiple sub-pixels includes a thin film transistor and a pixel electrode; the multiple sub-pixels include at least one first sub-pixel that emits light from a side of the second substrate away from the first substrate and at least one second sub-pixel that emits light from a side of the first substrate away from the second substrate; the first substrate in a first sub-pixel is provided with a first shielding pattern, and an orthographic projection of the pixel electrode in the first sub-pixel on a plane of the display panel is within a range of an orthographic projection of the first shielding pattern on the first substrate; the second substrate in a second sub-pixel is provided with a second shielding pattern, and an orthographic projection of the pixel electrode in the second sub-pixel on the plane of the display panel is within a range of an orthographic projection of the second shielding pattern on the second substrate; and cell aligning the first substrate and the second substrate, wherein a polymer-stabilized liquid crystal layer is provided between the first substrate and the second substrate.

Other aspects may be understood upon reading and understanding of the accompanying drawings and detailed descriptions.

BRIEF DESCRIPTION OF DRAWINGS

The drawings are intended to provide a further understanding of technical solutions of the present disclosure and form a part of the specification, and are used to explain the technical solutions of the present disclosure together with the embodiments of the present disclosure, and are not intended to form limitations on the technical solutions of the present disclosure. Shapes and sizes of various components in the drawings do not reflect actual scales, and are only intended to schematically illustrate contents of the present disclosure.

Figure 1:
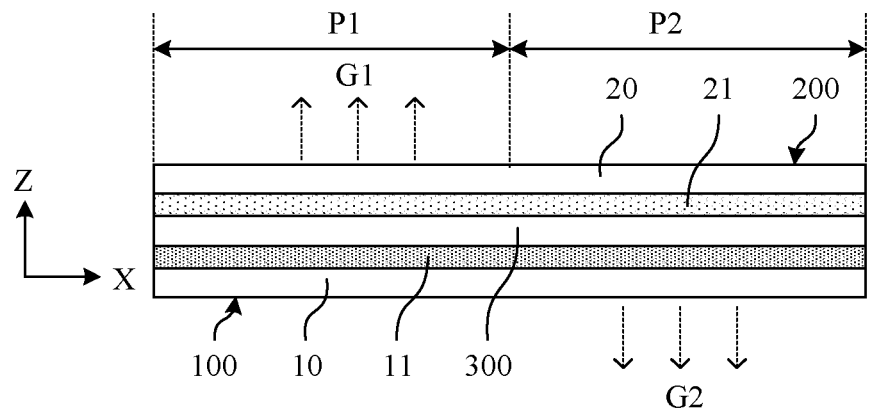
FIG. 1 is a schematic diagram of a cross-sectional structure of a display panel according to an exemplary embodiment of the present disclosure.

| Description of reference signs: |
| --- |
| 10-first base substrate; |
| 11-first structural layer; |
| 20-second base substrate; |
| 21-second structural layer; |
| 31-first insulating layer; |
| 32-second insulating layer; |
| 33-third insulating layer; |
| 34-fourth insulating layer; |
| 35-first alignment layer; |
| 41-gate line; |
| 42-data line; |
| 43-thin film transistor; |
| 44-pixel electrode; |
| 45-first common electrode line; |
| 46-second common electrode line; |
| 51-first shielding pattern; |
| 52-second shielding pattern; |
| 53-shielding strip; |
| 54-shielding block; |
| 60-common electrode; |
| 61-first opening; |
| 62-second opening; |
| 71-first protective layer; |
| 72-second alignment layer; |
| 81-gate electrode; |
| 82-active layer; |
| 83-source electrode; |
| 84-drain electrode; |
| 100-first substrate; |
| 200-second substrate; |
| 300-polymer-stabilized liquid crystal layer; |
| 400-light source; |
| 500-light guide plate; |
| 501-optical adhesive layer. |

DETAILED DESCRIPTION

To make purposes, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementation modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

Scales of the drawings in the present disclosure may be used as a reference in the actual process, but are not limited thereto. For example, a width-length ratio of a channel, thickness and spacing of each film layer, and width and spacing of each signal line may be adjusted according to actual needs. The number of pixels in the display substrate and the number of sub-pixels in each pixel are not limited to the numbers shown in the drawings. The drawings described in the present disclosure are schematic structural diagrams only, and one implementation mode of the present disclosure is not limited to the shapes, numerical values or the like shown in the drawings.

Ordinal numerals such as "first", "second", and "third" in the specification are set to avoid confusion between constituent elements, but are not intended to limit in terms of quantity.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions according to which the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the present specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above−10° and below 10°, and thus also includes a state in which the angle is above−5° and below 5°. In addition, "perpendicular" refers to a state in which an angle formed by two straight lines is above 800 and below 100°, and thus also includes a state in which the angle is above 850 and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon or hexagon in this specification are not strictly defined, and they may approximately be triangle, rectangle, trapezoid, pentagon or hexagon, etc. There may be some small deformation caused by tolerance, and there may be guide angle, arc edge and deformation, etc.

In the present disclosure, "about" refers to that a boundary is defined not so strictly and numerical values within process and measurement error ranges are allowed.

Double-sided transparent display is a display technology that may display different pictures on both sides of the display screen at the same time without affecting each other. It can not only make more efficient use of space in applications, achieve multi-functional display effects, but also contribute to privacy protection. At present, liquid crystal display technology, organic light emitting diode (OLED) display technology, electrochromic display technology and electrowetting display technology may be used in the double-sided transparent display. Practical application shows that the transparent display using liquid crystal display technology has a problem of low transmittance, which is about 20%. The transmittance of transparent display using OLED display technology may reach more than 60%, but there are some problems such as fast brightness attenuation and short service life. Transparent display using electrochromic display technology and electrowetting display technology has relatively high transmittance, but there is a problem of slow response speed. In addition, most of the transparent displays are transparent when a voltage is applied, but are opaque in a normal state, which not only has the problem of large power consumption, but also has the problem of crosstalk between displaying on the front and back surfaces.

An exemplary embodiment of the present disclosure provides a display panel, including a first substrate and a second substrate provided opposite to each other, and a polymer-stabilized liquid crystal layer provided between the first substrate and the second substrate. The first substrate includes multiple sub-pixels defined by intersection of multiple gate lines and multiple data lines, and each of the sub-pixels includes a thin film transistor and a pixel electrode. The multiple sub-pixels may include at least one first sub-pixel in which light is emitted from a side of the second substrate away from the first substrate and at least one second sub-pixel in which light is emitted from a side of the first substrate away from the second substrate. The first substrate in the first sub-pixel is provided with a first shielding pattern, and an orthographic projection of the pixel electrode in the first sub-pixel on a plane of the display panel is within a range of an orthographic projection of the first shielding pattern on the first substrate. The second substrate in the second sub-pixel is provided with a second shielding pattern, and an orthographic projection of the pixel electrode in the second sub-pixel on the plane of the display panel is within a range of an orthographic projection of the second shielding pattern on the second substrate.

By use of the polymer stabilized liquid crystal, the display panel of the double-sided transparent display according to an exemplary embodiment of the present disclosure not only effectively improves transparency and response speed of the double-sided transparent display, but also effectively reduces power consumption of the double-sided transparent display.

Polymer Stabilized Liquid Crystal (PSLC) may be called liquid crystal gel, which may be formed by a mixture of liquid crystal, polymerizable liquid crystal monomer and photoinitiator under ultraviolet irradiation. When the mixture is irradiated by ultraviolet light, the polymerizable liquid crystal monomer polymerizes, and a long chain direction of polymer is substantially consistent with a long axis direction of liquid crystal molecules. When the display panel is not working (powered off), the long axis direction of the liquid crystal molecules in the liquid crystal polymer is consistent with an extension direction of long chains in the liquid crystal polymer, and the polymer stabilized liquid crystal has high light transmittance, with a transmittance being up to about 90%. When the display panel is working (powered on), under the action of an electric field formed by the pixel electrode and the common electrode in the display panel, the liquid crystal molecules in the liquid crystal polymer are deflected, the liquid crystal polymer is in a scattering state due to the action of polymer network, and the display response speed is very fast, with the response speed being up to about 1 ms to 2 ms, so that the light passing through the polymer stabilized liquid crystal is emitted from one side of the first substrate or one side of the second substrate, thus implementing displaying of pictures. Therefore, the display panel according to the exemplary embodiment of the present disclosure using the polymer stabilized liquid crystal not only makes the display panel have higher transparency, effectively improves the transparency and the response speed of the double-sided transparent display, but also greatly reduces the power consumption of the display panel.

FIG. 1 is a schematic diagram of a cross-sectional structure of a display panel according to an exemplary embodiment of the present disclosure, and illustrates a structure of two sub-pixels. As shown in FIG. 1, in a plane perpendicular to the display substrate, the display panel may include a first substrate 100 and a second substrate 200 provided opposite each other, and a polymer-stabilized liquid crystal layer 300 provided between the first substrate 100 and the second substrate 200. In an exemplary embodiment, the first substrate 100 may include a first base substrate 10 and a first structural layer 11 provided on a side of the first base substrate 10 facing the second substrate 200, the second substrate 200 may include a second base substrate 20 and a second structural layer 21 provided on a side of the second base substrate 20 facing the first substrate 100, and the polymer-stabilized liquid crystal layer 300 is provided between the first structural layer 11 and the second structural layer 21.

In an exemplary embodiment, a display mode of the display panel may be electrically controlled birefringent (ECB), Twisted Nematic (TN), In Plane Switching (IPS), Advanced Super Dimension (ADS), or Vertical Alignment (VA), which is not limited herein. The following embodiments are described with an ECB type display panel as an example.

In an exemplary embodiment, the first structural layer 11 may include a gate line, a data line, a thin film transistor and a pixel electrode, and the second structural layer 21 may include a common electrode.

In an exemplary embodiment, the display panel may include multiple sub-pixels, wherein the multiple sub-pixels may include at least one first sub-pixel P1 and at least one second sub-pixel P2. The at least one second sub-pixel P2 is provided on a side of the at least one first sub-pixel P1 in a first direction X. In an exemplary embodiment, the at least one first sub-pixel P1 is configured to emit a first picture G1 from a side of the second substrate 200 away from the first substrate 100 (a third direction Z), so that a viewer located on a side of the third direction Z may see the first picture G1 displayed by the display panel. The second sub-pixel P2 is configured to emit a second picture G2 from a side of the first substrate 100 away from the second substrate 200 (an opposite direction of the third direction Z) so that a viewer located on an opposite side in the third direction Z may see the second picture G2 displayed by the display panel. In an exemplary embodiment, the first picture and the second picture may be different, the first direction X may be an extension direction of the gate line, and the third direction Z may be a direction perpendicular to a plane of the display panel.

In an exemplary embodiment, an overlapping area between the pixel electrode of the first substrate 100 and the common electrode of the second substrate 200 in the first sub-pixel P1 forms a first display area for displaying the first picture G1. The first structural layer 11 in the first sub-pixel P1 is provided with a first shielding pattern configured such that the first picture G1 can only be emitted from the second substrate 200 side, but not from the first substrate 100 side, and light is transmitted from an area other than the first display area, such that a first transparent area is formed.

In an exemplary embodiment, an overlapping area between the pixel electrode of the first substrate 100 and the common electrode of the second substrate 200 in the second sub-pixel P2 forms a second display area for displaying the second picture G2. The second structural layer 21 in the second sub-pixel P2 is provided with a second shielding pattern configured such that the second picture G2 can only be emitted from the first substrate 100 side but not from the second substrate 200 side, and light is transmitted from an area other than the second display area to form a second transparent area.

In an exemplary embodiment, the display panel may include a light source device configured to implement color display in a mode of Field Sequential Color (FSC). In an exemplary embodiment, the light source device may periodically and sequentially emit light of a first color, light of a second color and light of a third color according to timing sequence, such that one sub-pixel sequentially displays a sub-picture of the first color, a sub-picture of the second color and a sub-picture of the third color according to the timing sequence, and presents a full-color picture on the retina by temporal color mixing mode by using persistence of human eye vision.

In an exemplary embodiment, the light of the first color may be red light, the light of the second color may be green light, and the light of the third color may be blue light.

In an exemplary embodiment, the light source device may include a first light source configured to emit the light of the first color, a second light source configured to emit the light of the second color, and a third light source configured to emit the light of the third color. In an exemplary embodiment, the first light source, the second light source, and the third light source may be three independent light emitting devices, or may be an integrated as a monolithic light emitting device, which achieves periodic sequential emitting by using timing control.

In an exemplary embodiment, one frame of display period of the display panel may be divided into three light-emitting periods, wherein a light source of one color emits light in each of the three light-emitting periods, light-emitting intensity of the three light sources are the same, and the light-emitting intensity of each light source is constant. In the first light-emitting period, the first light source emits red light, and the red light is incident on each sub-pixel of the display panel, and a display gray scale of the sub-pixel in this period is adjusted by a data signal of a data line of the display panel. In the second light-emitting period, the second light source emits green light, and the green light is incident on each sub-pixel of the display panel, and a display gray scale of the sub-pixel in this period is adjusted by a data signal of a data line of the display panel. In the third light-emitting period, the third light source emits blue light, and the blue light is incident on each sub-pixel of the display panel, and a display gray scale of the sub-pixel in this period is adjusted by a data signal of a data line of the display panel. In this way, each sub-pixel of the display panel displays red with an adjusted first gray scale in the first light-emitting period, displays green in an adjusted second gray scale in the second light-emitting period, and displays blue in an adjusted third gray scale in the third light-emitting period. In one of frame display period, the color displayed by each sub-pixel is composed of red, green and blue of different gray scales. In related technology, the display panel forms color(s) through red sub-pixels, green sub-pixels and blue sub-pixels. Therefore, three sub-pixels are needed. In an exemplary embodiment of the present disclosure, the colors of pixels are formed in a time division manner in which red, green and blue are respectively displayed in one frame of display period, and only one sub-pixel is needed to present a desired color. Thus, upon comparison with an existing structure, the area of one pixel in the exemplary embodiment of the present disclosure is one third of the area of the pixel in the related technology, thereby increasing a display resolution by three times.

In an exemplary embodiment, Light Emitting Diodes (LED) may be used as the first light source, the second light source, and the third light source. The LED has advantages such as high contrast, high brightness, high yield, special-shaped cutting characteristics, better color rendering and the like, and therefore are conducive to lightness and thinness of the display device, which is not limited in the present disclosure.

Figure 2A:
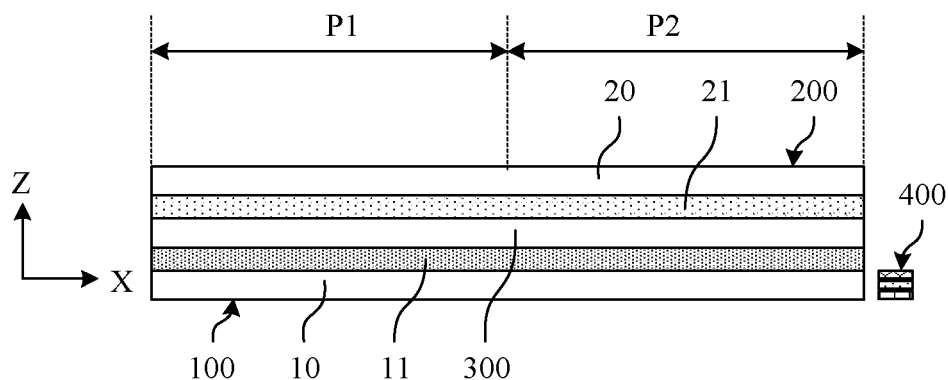
FIGS. 2a-2e are schematic diagrams of a light source device according to an exemplary embodiment of the present disclosure.

FIGS. 2a-2e are schematic diagrams of a light source device according to an exemplary embodiment of the present disclosure. In an exemplary embodiment, the light source device may include a light source 400, wherein the light source 400 may be provided on a side surface of the first substrate 100, as shown in FIG. 2a. The light source 400 is configured to emit light to the first base substrate 10, and the first substrate 10 as a light guide structure conducts light through total reflection, and emits light in a first display area and a second display area, thereby displaying pictures of different gray scales.

Figure 2B:
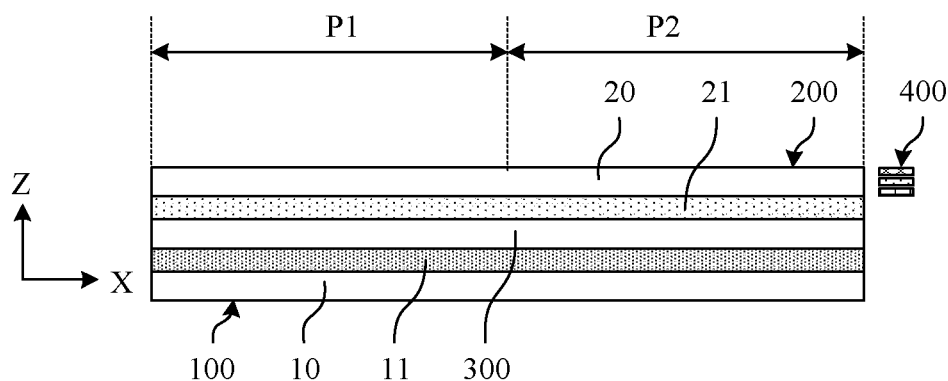

In an exemplary embodiment, the light source device may include a light source 400, wherein the light source 400 may be provided on a side surface of the second substrate 200, as shown in FIG. 2b. The light source 400 is configured to emit light to the second base substrate 20, and the second base substrate 20 as a light guide structure conducts light through total reflection, and emits light in the first display area and the second display area, thereby displaying pictures of different gray scales.

Figure 2C:
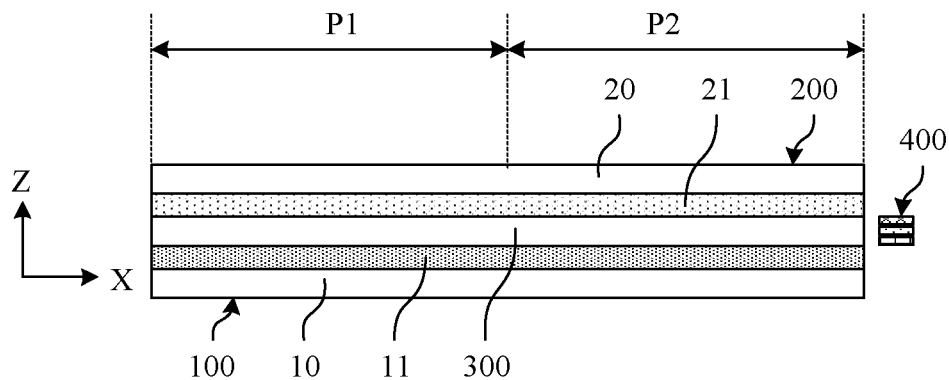

In an exemplary embodiment, the light source device may include a light source 400, wherein the light source 400 may be provided on a side surface of the polymer-stabilized liquid crystal layer 300, as shown in FIG. 2c. The light source 400 is configured to emit light to the polymer-stabilized liquid crystal layer 300. By configuring the refractive index of the polymer-stabilized liquid crystal layer 300 to be greater than the refractive index of alignment layers on both sides thereof, the polymer-stabilized liquid crystal layer 300 as a light guide structure conducts light and emits light to the first display area and the second display area, thereby displaying pictures of different gray scales.

Figure 2D:
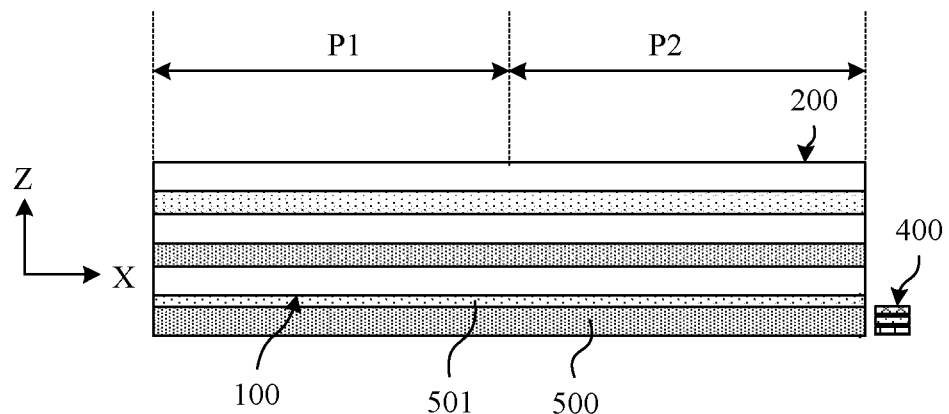

In an exemplary embodiment, the light source device may include a light source 400 and a light guide plate 500. The light guide plate 500 may be provided on a side of the first substrate 100 away from the second substrate 200. The light guide plate 500 is connected to the first substrate 100 through an optical adhesive layer 501, and the light source 400 is provided a side surface of the light guide plate 500, as shown in FIG. 2d. The light source 400 is configured to emit light to the light guide plate 500, and the light guide plate 500 as a light guide structure conducts light through total reflection, and emits light in the first display area and the second display area, thereby displaying pictures of different gray scales.

Figure 2E:
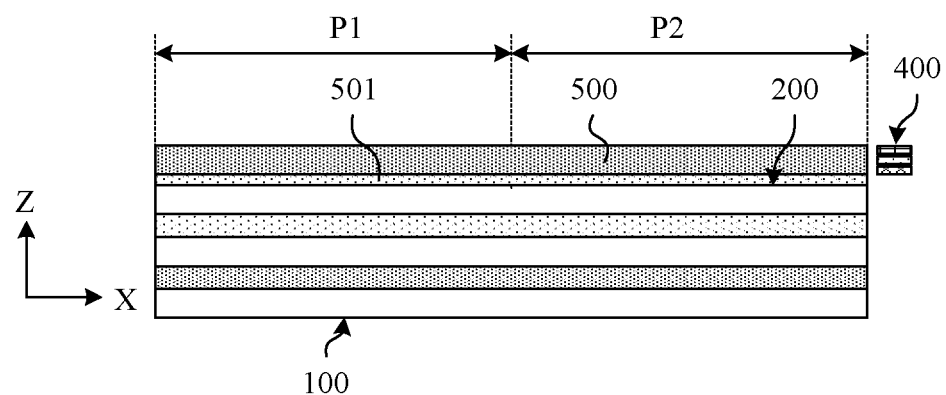

In an exemplary embodiment, the light source device may include a light source 400 and a light guide plate 500. The light guide plate 500 may be provided on a side of the second substrate 200 away from the first substrate 100. The light guide plate 500 is connected to the second substrate 200 through an optical adhesive layer 501, and the light source 400 is provided a side surface of the light guide plate 500, as shown in FIG. 2e. The light source 400 is configured to emit light to the light guide plate 500, and the light guide plate 500 as a light guide structure conducts light through total reflection, and emits light in the first display area and the second display area, thereby displaying pictures of different gray scales.

In an exemplary embodiment, the light sources 400 may be provided at a side surface of the first substrate 100 and a side surface of the second substrate 200 at the same time or at two side surfaces of the first substrate 100 and the like, which is not limited in the present disclosure.

FIGS. 3a-3e are schematic diagrams of a planar structure of a display panel according to an exemplary embodiment of the present disclosure. In a plane parallel to the display substrate, the display panel may include multiple gate lines 41 and multiple data lines 42. The multiple gate lines 41 may extend along a first direction X and are provided sequentially in a second direction Y, and the multiple data lines 42 may extend along the second direction Y and are provided sequentially in the first direction X. The multiple gate lines 41 and the multiple data lines 42 intersect to define multiple sub-pixels in a regular arrangement, and the first direction X and the second direction Y intersect with each other. In an exemplary embodiment, the multiple sub-pixels may form multiple pixel rows in which the multiple sub-pixels are provided sequentially in the first direction X, and multiple pixel columns in which the multiple sub-pixels are provided sequentially in the second direction Y.

In an exemplary embodiment, the multiple sub-pixels may include multiple first sub-pixels P1 and multiple second sub-pixels P2, wherein the first sub-pixels P1 are configured to display a first picture from one light-emitting surface of the display panel and the multiple second sub-pixels P2 are configured to display a second picture from another light-emitting surface of the display panel, and the first picture and the second picture may be different.

Figure 3A:
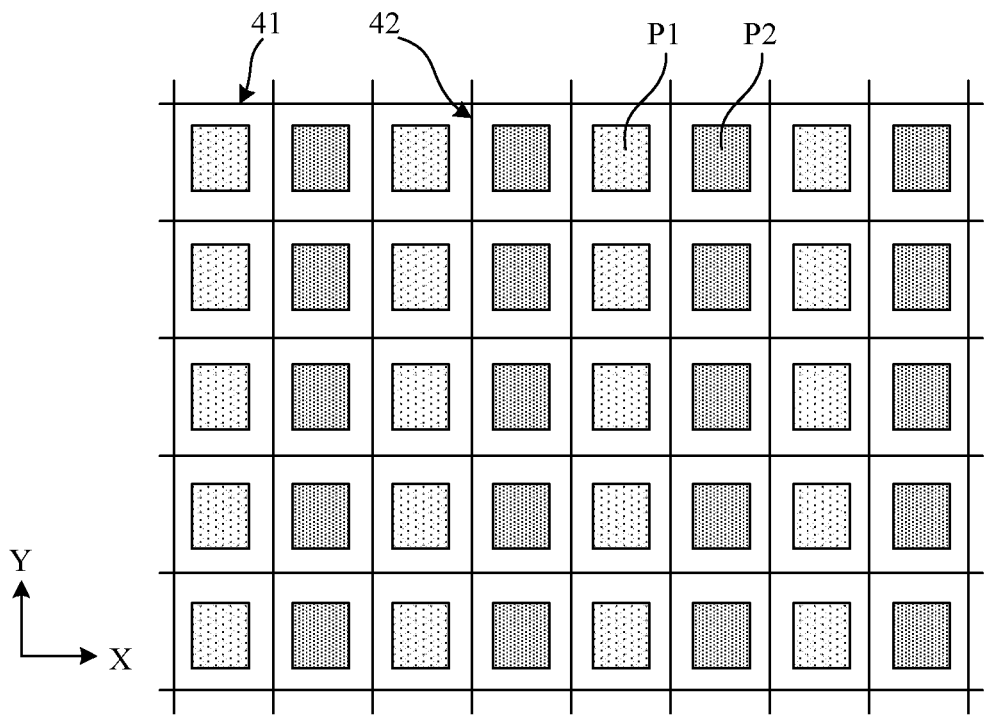
FIGS. 3a-3e are schematic diagrams of a planar structure of a display panel according to an exemplary embodiment of the present disclosure.

In an exemplary embodiment, the first sub-pixels P1 may be provided in odd-numbered pixel columns, such as a first pixel column, a third pixel column, a fifth pixel column, . . . , and the second sub-pixels P2 may be provided in even-numbered pixel columns, such as a second pixel column, a fourth pixel column, a sixth pixel column, . . . , as shown in FIG. 3a.

Figure 3B:
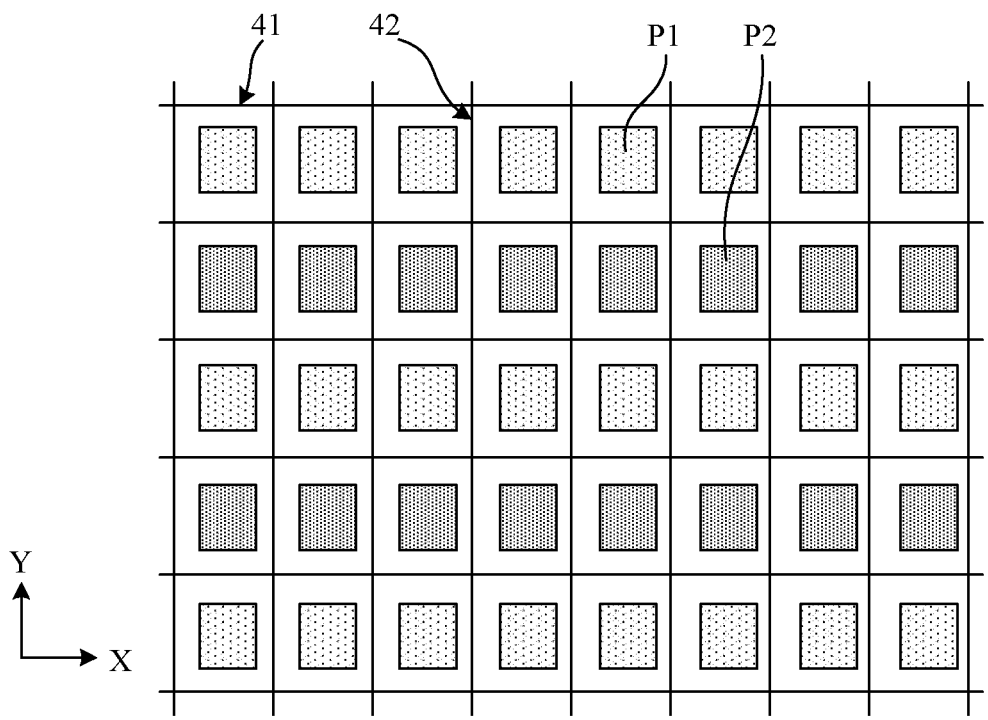

In another exemplary embodiment, the first sub-pixels P1 may be provided in odd-numbered pixel rows, such as a first pixel row, a third pixel row, a fifth pixel row . . . , and the second sub-pixels P2 may be provided in even-numbered pixel rows, such as a second pixel row, a fourth pixel row, a sixth pixel row . . . , as shown in FIG. 3b.

Figure 3C:
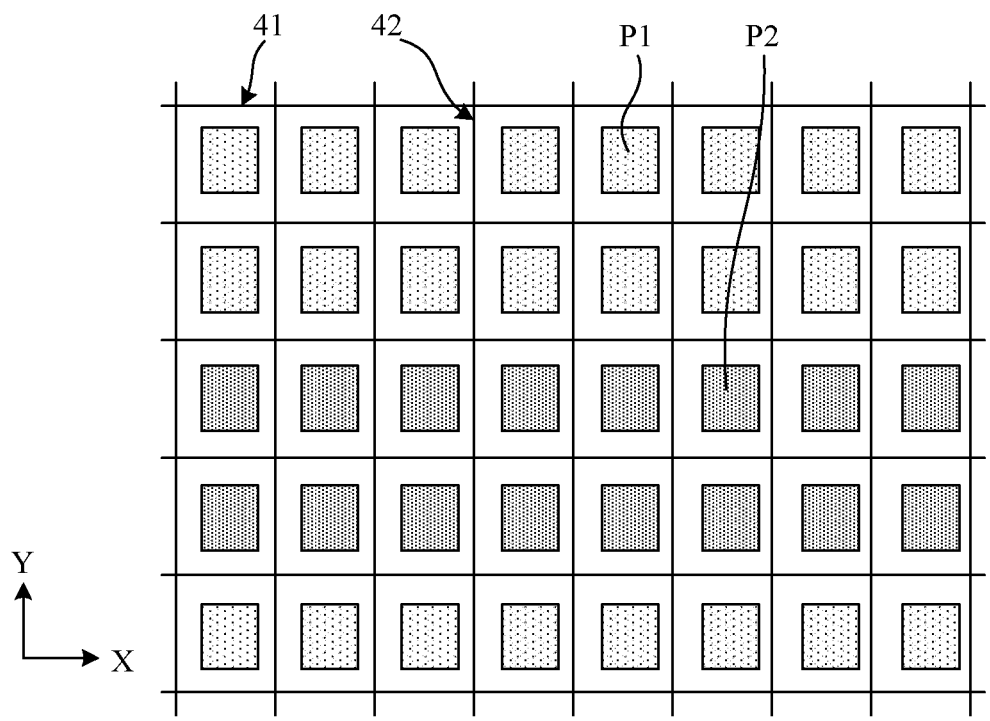

In yet another exemplary embodiment, the first sub-pixels P1 may be provided in several consecutive pixel rows, such as the first pixel row and the second pixel row, and the second sub-pixels P2 may be provided in several other consecutive pixel rows, such as the third pixel row and the fourth pixel row . . . , as shown in FIG. 3c. Alternatively, the first sub-pixels P1 may be provided in several consecutive pixel columns, such as the first pixel column and the second pixel column . . . , and the second sub-pixels P2 may be provided in several other consecutive pixel columns, such as the third pixel column and the fourth pixel column . . . .

Figure 3D:
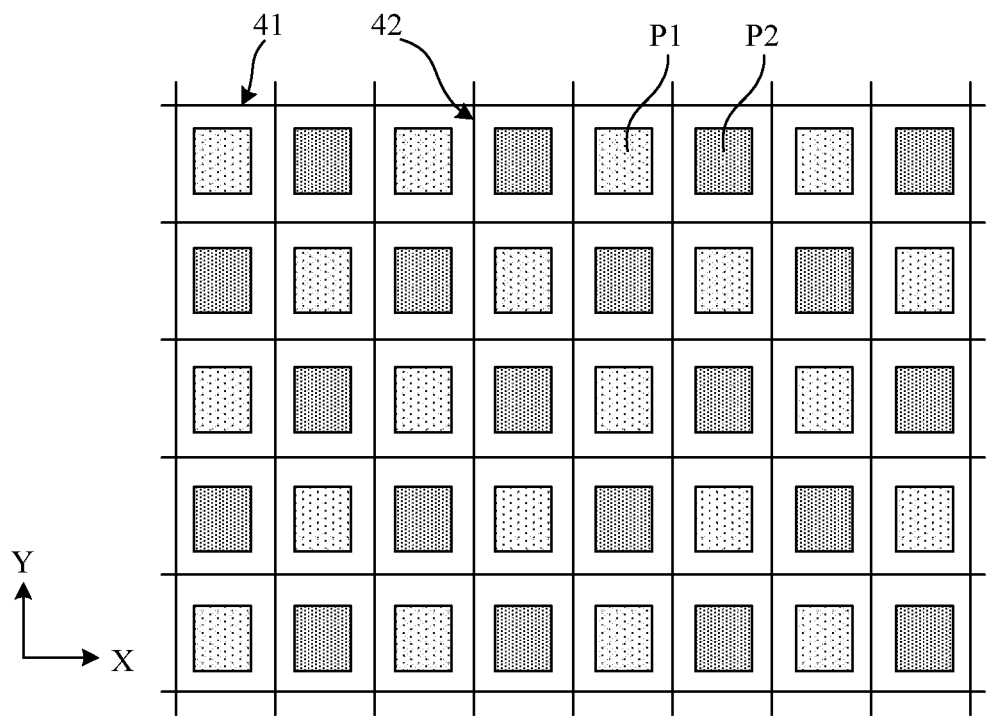

In another exemplary embodiment, the first sub-pixels P1 and the second sub-pixels P2 may be alternately provided in the first direction X, and the first sub-pixels P1 and the second sub-pixels P2 may be alternately provided in the second direction Y. For example, the first sub-pixels P1 may be provided in the first pixel column, the third pixel column, the fifth pixel column . . . of the first pixel row, and may be provided in the second pixel column, the fourth pixel column, the sixth pixel column . . . of the second pixel row, and the second sub-pixels P2 may be provided in the second pixel column, the fourth pixel column, the sixth pixel column . . . of the first pixel row, and may be provided in the first pixel row, the third pixel row, fifth pixel row . . . of the second pixel row, as shown in FIG. 3d.

Figure 3E:
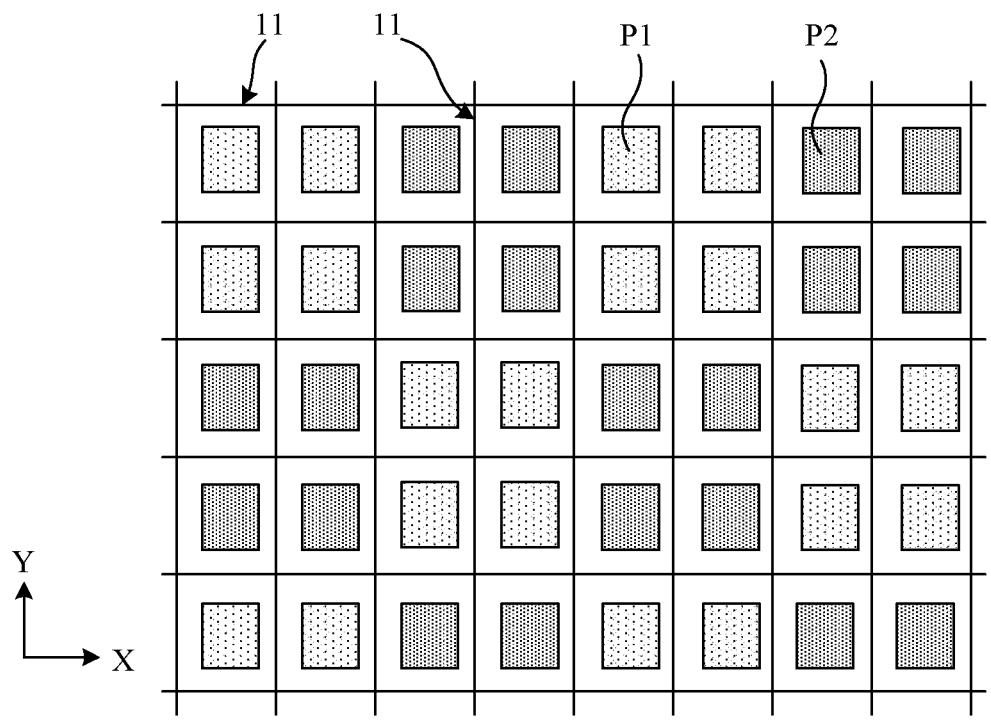

In another exemplary embodiment, the display panel may include multiple first pixel areas and multiple second pixel areas, wherein the first pixel areas and the second pixel areas may be alternately provided in the first direction X, the first pixel areas and the second pixel areas may be alternately provided in the second direction Y. Each first pixel area may include multiple first sub-pixels P1, and each second pixel area may include multiple second sub-pixels P2. For example, the first pixel area may include four first sub-pixels P1 which are located in the first pixel row and the first pixel column, in the first pixel row and the second pixel column, in the second pixel row and the first pixel column, and in the second pixel row and the second pixel column, respectively. The second pixel area may include four second sub-pixels P2 which are located in the first pixel row and the third pixel column, in the first pixel row and the fourth pixel column, in the second pixel row and the third pixel column, and in the second pixel row and the fourth pixel column, as shown in FIG. 3e.

In an exemplary embodiment, the first sub-pixels P1 and the second sub-pixels P2 in the display panel may be provided in other ways, which are not limited in the present disclosure.

Figure 4:
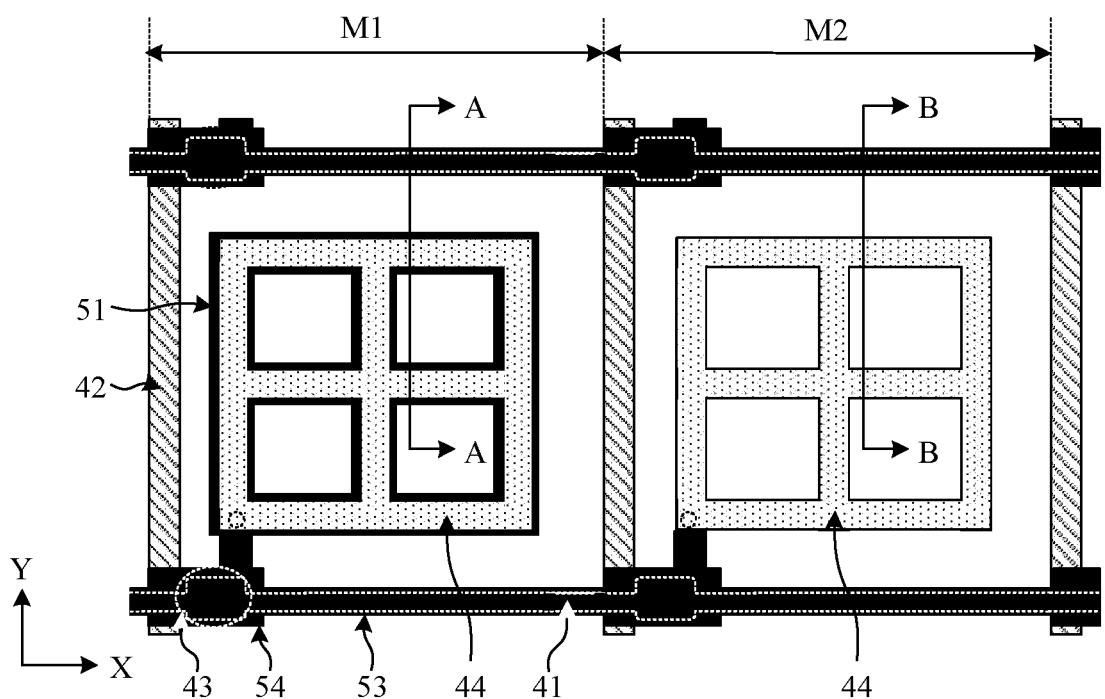
FIG. 4 is a schematic diagram of a planar structure of a first substrate according to an exemplary embodiment of the present disclosure.

FIG. 4 is a schematic diagram of a planar structure of a first substrate according to an exemplary embodiment of the present disclosure, illustrating a planar structure of a first array sub-area M1 and a second array sub-area M2, wherein the first array sub-area M1 and the second array sub-area M2 are configured to form a first sub-pixel and a second sub-pixel respectively after the first substrate and the second substrate are cell aligned. As shown in FIG. 4, in a plane parallel to the display substrate, the first substrate may include two gate lines 41 parallel to each other and three data lines 42 parallel to each other. The two gate lines 41 and the three data lines 42 perpendicularly intersect with each other to define a first array sub-area M1 and a second array sub-area M2. The first array sub-area M1 and the second array sub-area M2 are each provided with a thin film transistor 43, a pixel electrode 44 and a shielding pattern.

In an exemplary embodiment, the thin film transistor 43 in each array sub-area may be provided near an overlapping area between a gate line 41 and a data line 42. The thin film transistor 43 may include a gate electrode connected to the gate line 41, an active layer, a source electrode connected to the data line 42, and a drain electrode connected to the pixel electrode 44. In an exemplary embodiment, the gate electrode may be an integral structure interconnected with the gate line 41, the source electrode may be an integral structure interconnected with the data line 42, and the drain electrode may be connected with the pixel electrode 44 through a via hole.

In an exemplary embodiment, the pixel electrode 44 in each array sub-area may be provided in a middle area of the sub-area, and the pixel electrode 44 may be in a block shape, a strip shape or a grid shape composed of strip shapes. Taking the grid-shaped pixel electrode 44 in FIG. 4 as an example, the pixel electrode 44 may include multiple first electrode strips extending along the first direction X and multiple second electrode strips extending along the second direction Y, wherein the multiple first electrode strips and the multiple second electrode strips intersect with each other to form the grid-shaped pixel electrode 44.

In an exemplary embodiment, a shielding structure in the first array sub-area M1 is different from a shielding structure in the second array sub-area M2 because the direction in which the first sub-pixel displays a picture is different from the direction in which the second sub-pixel displays a picture.

In an exemplary embodiment, the shielding pattern in the first array sub-area M1 may include a first shielding pattern 51. Shape and position of the first shielding pattern 51 may correspond to the shape and position of the pixel electrode 44 in the first array sub-area M1. Taking the grid-shaped first shielding pattern 51 in FIG. 4 as an example, the first shielding pattern 51 may include multiple first shielding strips extending along the first direction X and multiple second shielding strips extending along the second direction Y. The multiple first shielding strips and the multiple second shielding strips intersect with each other to form the grid-shaped first shielding pattern 51. In the second direction Y, a width of a first shielding strip may be greater than a width of a first electrode strip, and an orthographic projection of the first shielding strip on the first base substrate includes an orthographic projection of the first electrode strip on the first base substrate. In the first direction X, a width of a second shielding strip may be greater than a width of a second electrode strip, and an orthographic projection of the second shielding strip on the first base substrate includes an orthographic projection of the second electrode strip on the first base substrate. Thus, an orthographic projection of the pixel electrode 44 on the first base substrate may be within a range of an orthographic projection of the first shielding pattern 51 on the first base substrate to achieve shielding of the pixel electrode 44.

In an exemplary embodiment, the shielding pattern in the first array sub-area M1 may include a shielding strip 53. The shielding strip 53 may be a strip extending along the first direction X, and the shape and position of the shielding strip 53 may correspond to shape and position of the gate line 41. A width of the shielding strip 53 may be greater than a width of the gate line 41 in the second direction Y, so that an orthographic projection of the gate line 41 on the first base substrate may be within a range of an orthographic projection of the shielding strip 53 on the first base substrate, thereby achieving shielding of the gate line 41.

In one possible exemplary embodiment, the shielding strip 53 in the first array sub-area M1 may be a strip extending in the second direction Y. The shape and position of the shielding strip 53 may correspond to shape and position of the data line 42. A width of the shielding strip 53 may be greater than a width of the data line 42 in the first direction X, so that an orthographic projection of the data line 42 on the first base substrate may be within a range of an orthographic projection of the shielding strip 53 on the first base substrate to achieve shielding of the data line 42.

In another possible exemplary embodiment, the shielding strip 53 in the first array sub-area M1 may include strips extending along the first direction X and the second direction Y, respectively. The shape and position of the shielding strip 53 may correspond to the shapes and positions of the gate line 41 and the data line 42, respectively. The width of the shielding strip 53 may be larger than a width of each of the gate line 41 and the data line 42, so that an orthographic projection of the gate line 41 and the data line 42 on the first base substrate may be within a range of the orthographic projection of the shielding strip 53 on the first base substrate to achieve shielding of the gate line 41 and the data line 42.

In an exemplary embodiment, shapes and positions of the shielding strips may be provided according to the arrangement of the light source device, and an extension direction of the shielding strips may be perpendicular to a propagation direction of the light incident into the display panel by a light source device. For example, if the light source device is disposed on a side surface of the display panel in the first direction X, light reflection of the data lines is stronger because the propagation direction of the light is substantially perpendicular to the extension direction of the data lines, and light reflection of the gate lines is weaker because the propagation direction of the light is substantially parallel to the extension direction of the gate lines. Therefore, it is possible to only provide the shielding strips for shielding the data lines, without providing the shielding strips for shielding the gate lines, so as to reduce an area occupied by the light shielding layer and improve the transmittance. For another example, if the light source device is provided on a side surface of the display panel in the second direction Y, light reflection of the gate lines is stronger because the propagation direction of the light is substantially perpendicular to the extension direction of the gate lines, and light reflection of the data lines is weaker because the propagation direction of the light is basically parallel to the extension direction of the data lines. Therefore, it is possible to only provide the shielding strips for shielding the gate lines, without providing the shielding strips for shielding the data lines, so as to reduce the area occupied by the light shielding layer and improve the transmittance. For another example, if a light guide plate of the light source device is provided on a a side of the display panel in the third direction X, since the propagation direction of the light is substantially perpendicular to the extension directions of the gate lines and the data lines, and the light reflection of the gate lines and the data lines is stronger. Therefore, shielding strips for shielding the gate lines and the data lines may be provided.

In an exemplary embodiment, the shielding pattern in the first array sub-area M1 may include a shielding block 54, wherein a position of the shielding block 54 corresponds to a position of the thin film transistor 43, so that an orthographic projection of the thin film transistor 43 on the first base substrate may be within a range of an orthographic projection of the shielding block 54 on the first base substrate, thereby achieving shielding of the area where the thin film transistor 43 is located.

In an exemplary embodiment, the shielding strip 53 and the shielding block 54 may be connected to each other to form an integral structure.

In an exemplary embodiment, the shielding pattern in the second array sub-area M2 may include the shielding strip 53 and the shielding block 54, and the structures of the shielding strip 53 and the shielding block 54 in the second array sub-area M2 may be the same or similar to those in the first array sub-area M1.

In an exemplary embodiment, the first substrate may include a common electrode line. The common electrode line includes a first common electrode line provided on a side of the gate line and parallel to the gate line and a second common electrode line provided on a side of the data line and parallel to the data line. The first common electrode line is provided in a same layer as the gate line and formed simultaneously by a same patterning process, and the second common electrode line is provided in a same layer as the data line and formed simultaneously by a same patterning process. In an exemplary embodiment, the first common electrode line within each array sub-area may include a first sub-line segment, a second sub-line segment, and a connection line segment. The first sub-line segment and the second sub-line segment are provided at intervals, provided in the same layer as the gate line and formed simultaneously by the same patterning process. The connection line segment is provided in a same layer as the pixel electrode and formed simultaneously by a same patterning process. The connection line segment is respectively connected with the first sub-line segment and the second sub-line segment through via holes to form the first common electrode line parallel to the gate line. In an exemplary embodiment, a shielding strip may shield the first common electrode line and/or the second common electrode line, wherein an orthographic projection of the first common electrode line and/or the second common electrode line on the first base substrate may be within a range of an orthographic projection of the shielding strip on the first base substrate. In another exemplary embodiment, the shielding strip may not shield the connection line segment in the first common electrode line, and there is no overlapping area between an orthographic projection of the connection line segment on the first base substrate and the orthographic projection of the shielding strip on the first base substrate, which may reduce the area occupied by the light shielding layer, so as to improve the transmittance.

Figure 5:
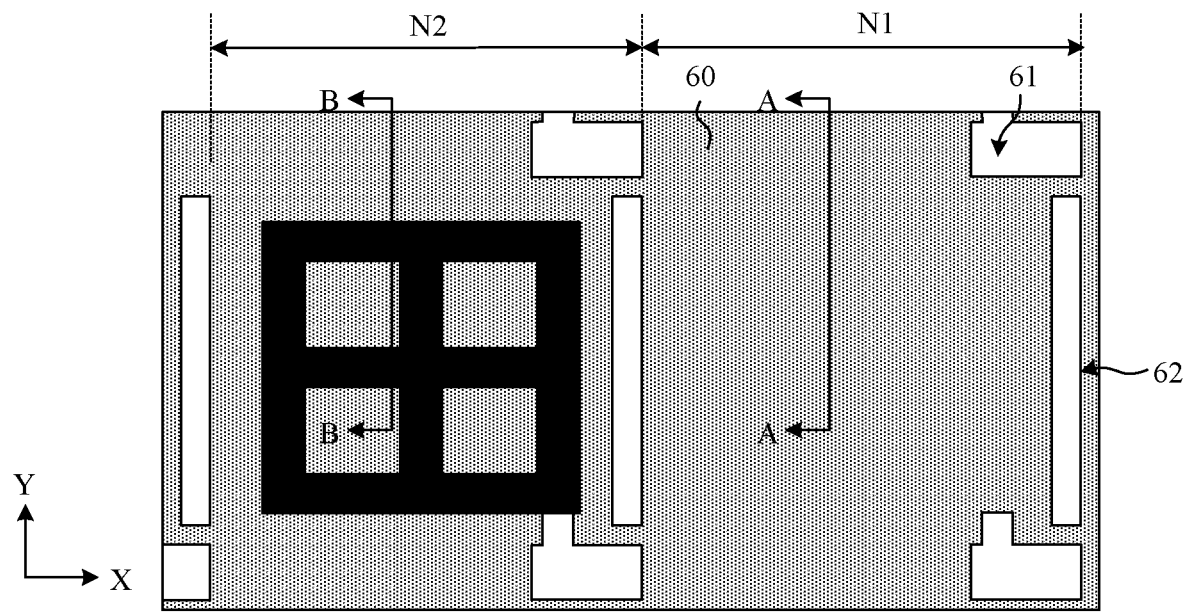
FIG. 5 is a schematic diagram of a planar structure of a second substrate according to an exemplary embodiment of the present disclosure.

FIG. 5 is a schematic diagram of a planar structure of a second substrate according to an exemplary embodiment of the present disclosure, illustrating a planar structure of a first opposite sub-area N1 and a second opposite sub-area N2. The first opposite sub-area N1 and the second opposite sub-area N2 are configured to form a first sub-pixel and a second sub-pixel respectively after the first substrate and the second substrate are cell aligned. As shown in FIG. 5 and in combination with FIG. 4, in a plane parallel to the display substrate, the second substrate may include a first array sub-area M1 and a second opposite sub-area N2, wherein position and shape of the first array sub-area M1 in the second substrate correspond to position and shape of the first array sub-area M1 in the first substrate, position and shape of the second opposite sub-area N2 correspond to position and shape of the second array sub-area M2 in the first substrate. The first opposite sub-area N1 and the second opposite sub-area N2 are each provided with a common electrode 60, and the second opposite sub-area N2 is further provided therein with a shielding pattern.

In an exemplary embodiment, the common electrode 60 in each of the opposite sub-areas is provided in an entire area of the opposite sub-area, which is a whole-surface structure, and multiple openings may be provided on the common electrode 60. Taking the common electrode 60 with a whole-surface structure in FIG. 5 as an example, the multiple openings on the common electrode 60 may include at least a first opening 61 and a second opening 62. Position and shape of the first opening 61 may correspond to the position and shape of the thin film transistor 43 on the first substrate, and position and shape of the second opening 62 may correspond to the position and shape of the data line 42 on the first substrate. In an exemplary embodiment, an orthographic projection of the thin film transistor 43 on the second substrate may be within a range of an orthographic projection of the first opening 61 on the second substrate, and an orthographic projection of a portion of the data lines 42 on the second substrate may be within a range of an orthographic projection of the second opening 62 on the second substrate. In an exemplary embodiment, the first opening 61 and the second opening 62 are configured to reduce parasitic capacitance between the common electrode on the second substrate and the data lines and the thin film transistor on the first substrate and to reduce load of the display panel.

In an exemplary embodiment, the shielding structure in the first opposite sub-area N1 is different from the shielding structure in the second opposite sub-area N2 because the direction in which the first sub-pixel displays a picture is different from the direction in which the second sub-pixel displays a picture.

In an exemplary embodiment, the first opposite sub-area N1 may not be provided with a shielding pattern, while the shielding pattern in the second opposite sub-area N2 may include a second shielding pattern 52, wherein shape and position of the second shielding pattern 52 may correspond to the shape and position of the pixel electrode 44 in the second array sub-area M2. Taking the grid-shaped second shielding pattern 52 in FIG. 5 as an example, the second shielding pattern 52 may include multiple third shielding strips extending along the first direction X and multiple fourth shielding strips extending along the second direction Y. The multiple third shielding strips and the multiple fourth shielding strips intersect with each other to form the grid-shaped second shielding pattern 52. In the second direction Y, a width of a third shielding strip may be greater than a width of the first electrode strip in the pixel electrode, wherein an orthographic projection of the third shielding strip on the second base substrate includes an orthographic projection of the first electrode strip on the second base substrate. In the first direction X, a width of the fourth shielding strip may be greater than a width of a second electrode strip in the pixel electrode, wherein an orthographic projection of the fourth shielding strip on the second base substrate includes an orthographic projection of the second electrode strip on the second base substrate. Thus, an orthographic projection of the pixel electrode 44 on the second substrate may be within a range of an orthographic projection of the second shielding pattern 52 on the second substrate to achieve shielding of the pixel electrode.

Figure 6:
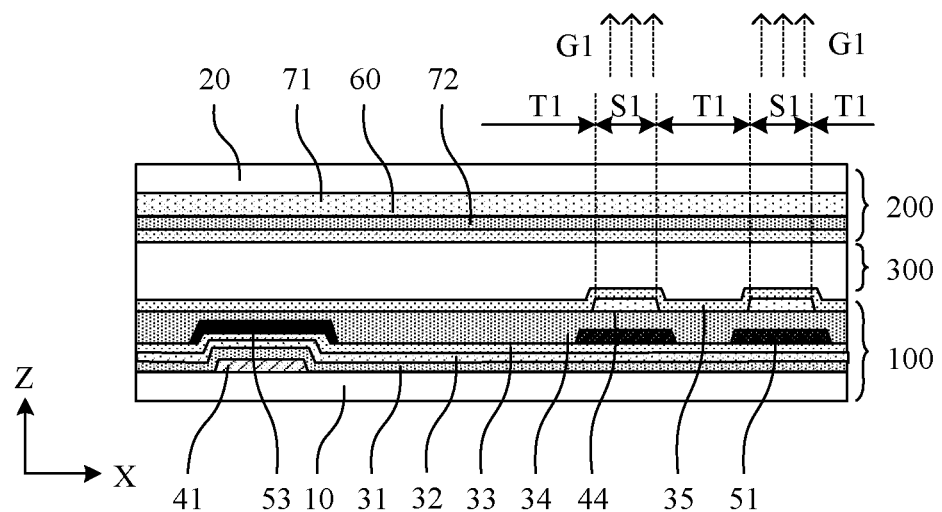
FIG. 6 is a schematic diagram of a cross-sectional structure of a first sub-pixel according to an exemplary embodiment of the present disclosure.

FIG. 6 is a schematic diagram of a cross-sectional structure of a first sub-pixel according to an exemplary embodiment of the present disclosure, which is a cross-sectional view taken along a A-A in FIG. 4 and FIG. 5. The cross-sectional structure of the first sub-pixel is the cross-sectional structure after the first substrate and the second substrate are cell aligned. During cell aligning, the second substrate is first turned over and then it is cell aligned with the first substrate, so that the first array sub-area of the substrate and the first opposite sub-area of the second substrate are accurately aligned to together form the first sub-pixel P1.

As shown in FIG. 6, in an exemplary embodiment, the first substrate 100 of the first sub-pixel P1 may include: a first base substrate 10, a gate line 41 provided on the first base substrate 10, a first insulating layer 31 covering the gate line 41, a second insulating layer 32 provided on a side of the first insulating layer 31 away from the first base substrate 10, a third insulating layer 33 provided on a side of the second insulating layer 32 away from the first base substrate 10, a first shielding pattern 51 and a shielding strip 53 provided on a side of the third insulating layer 33 away from the first base substrate 10, a fourth insulating layer 34 covering the first shielding pattern 51 and the shielding strip 53, a pixel electrode 44 provided on the side of the third insulating layer 33 away from the first base substrate 10, and a first alignment layer 35 covering the pixel electrode 44.

As shown in FIG. 6, in an exemplary embodiment, the second substrate 200 of the first sub-pixel P1 may include a second base substrate 20, a first protective layer 71 provided on the second base substrate 20, a common electrode 60 provided on a side of the first protective layer 71 away from the second base substrate 20, and a second alignment layer 72 covering the common electrode 60.

In an exemplary embodiment, the first shielding pattern 51 is configured to shield the pixel electrode 44, and the shielding strip 53 is configured to shield the gate line 41. Since there is a first overlapping area between an orthographic projection of the pixel electrode 44 of the first substrate 100 on the first base substrate and an orthographic projection of the common electrode 60 of the second substrate 200 on the first base substrate, when the display panel works, the pixel electrode 44 and the common electrode 60 in the first overlapping area form an electric field that drives the polymer-stabilized liquid crystal layer 300 to deflect. The liquid crystal polymer is in a scattering state, light passing through the polymer stabilized liquid crystal is emitted from a side of the second substrate 200, and a first picture G1 is displayed on a side in the third direction Z, so that a first display area S1 displaying the first picture G1 is formed at a position where the first overlapping area is located, and the viewer located on the side in the third direction Z may see the first picture G1 displayed in the first display area S1. Since the first shielding pattern 51 shields the first display area S1, a viewer located on the opposite side in the third direction Z cannot see the first picture G1 displayed in the first display area S1. In an area not shielded by the first shielding pattern 51 and the shielding strip 53, light may pass through the first substrate 100, the polymer-stabilized liquid crystal layer 300, and the second substrate 200, so that a first transparent area T1 is formed. A viewer located on the side in the third direction Z may see a scene where the first substrate 100 is away from the second substrate 200, and a viewer located on the opposite side in the third direction Z may see a scene where the second substrate 200 is away from the first substrate 100. When the display panel is not working, the first display area S1 does not display a picture, the area shielded by the first shielding pattern 51 and the shielding strip 53 does not transmit light, so that the area not shielded by the first shielding pattern 51 and the shielding strip 53 forms a first transparent area T1, and a viewer located on the side in the third direction Z may see a scene where the first substrate 100 is away from the second substrate 200, and a viewer located on the opposite side in the third direction Z may see a scene where the second substrate 200 is away from the first substrate 100.

Figure 7:
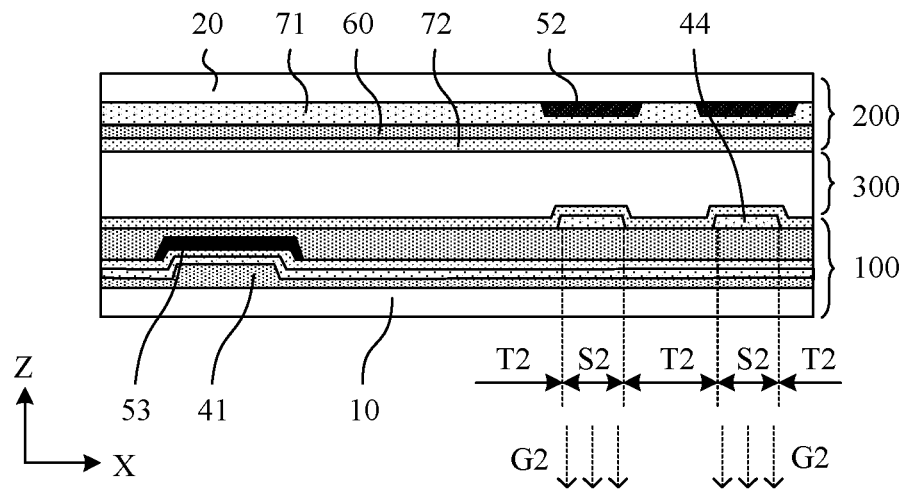
FIG. 7 is a schematic diagram of a cross-sectional structure of a second sub-pixel according to an exemplary embodiment of the present disclosure.

FIG. 7 is a schematic diagram of a cross-sectional structure of a second sub-pixel according to an exemplary embodiment of the present disclosure, which is a cross-sectional view taken along B-B in FIG. 4 and FIG. 5. The cross-sectional structure of the second sub-pixel is the cross-sectional structure after the first substrate and the second substrate are cell aligned. During cell aligning, the second substrate is first turned over and then it is cell aligned with the first substrate, so that the second array sub-area of the first substrate and the second opposite sub-area of the second substrate are accurately aligned to together form the second sub-pixel P2.

As shown in FIG. 7, in an exemplary embodiment, the first substrate 100 and the second substrate 200 of the second sub-pixel P2 may have structures similar to those of the first substrate 100 and the second substrate 200 of the first sub-pixel P1. The difference lies in that the first substrate 100 of the first sub-pixel P1 is provided with the first shielding pattern 51, while the first substrate 100 of the second sub-pixel P2 is not provided with the first shielding pattern 51, and the second substrate 200 of the first sub-pixel P1 is not provided with the second shielding pattern 52, while the second substrate 200 of the second sub-pixel P2 is provided with the second shielding pattern 52.

As shown in FIG. 7 and in combination with FIG. 6, in an exemplary embodiment, the first substrate 100 of the second sub-pixel P2 may include a first base substrate 10, a gate line 41 provided on the first base substrate 10, a first insulating layer 31 covering the gate line 41, a second insulating layer 32 provided on a side of the first insulating layer 31 away from the first base substrate 10, a third insulating layer 33 provided on a side of the second insulating layer 32 away from the first base substrate 10, a fourth insulating layer 34 provided on a side of the third insulating layer 33 away from the first base substrate 10, a pixel electrode 44 provided on a side of the fourth insulating layer 34 away from the first base substrate 10, and a first alignment layer 35 covering the pixel electrode 44.

As shown in FIG. 7, in an exemplary embodiment, the second substrate 200 of the first sub-pixel P2 may include a second base substrate 20, a second shielding pattern 52 provided on the second base substrate 20, a first protective layer 71 covering the second shielding pattern 52, a common electrode 60 provided on a side of the first protective layer 71 away from the second base substrate 20, and a second alignment layer 72 covering the common electrode 60.

In an exemplary embodiment, the second shielding pattern 52 is configured to shield the pixel electrode 44. Since there is a second overlapping area between an orthographic projection of the pixel electrode 44 of the first substrate 100 on the second base substrate and an orthographic projection of the common electrode 60 of the second substrate 200 on the second base substrate, when the display panel is working, the pixel electrode 44 and the common electrode 60 in the second overlapping area form an electric field that drives the polymer-stabilized liquid crystal layer 300 to deflect. The liquid crystal polymer is in scattering state, light passing through the polymer stabilized liquid crystal is emitted from a side of the first substrate 100, and a second picture G2 is displayed on the opposite side in the third direction Z, so that a second display area S2 for displaying the second picture G2 is formed at a position where the second overlapping area is located, and a viewer on the opposite side in the third direction Z may see the second picture G2 displayed in the second display area S2. Since the second shielding pattern 52 shields the second display area S2, a viewer located on the side in the third direction Z cannot see the second picture G2 displayed in the second display area S2. In an area not shielded by the second shielding pattern 52, light may pass through the second substrate 200, the polymer-stabilized liquid crystal layer 300 and the first substrate 100, so that a second transparent area T2 is formed. A viewer located on the opposite side of the third direction Z may see a scene where the second substrate 200 is away from the first substrate 100, and a viewer located on the side in the third direction Z may see a scene where the first substrate 100 is away from the second substrate 200. When the display panel is not working, the second display area S2 does not display a picture, the area shielded by the second shielding pattern 52 does not transmit light, the area not shielded by the second shielding pattern 52 forms a second transparent area T2, and a viewer located on the side in the third direction Z may see a scene where the first substrate 100 is away from the second substrate 200, and a viewer located on the opposite side in the third direction Z may see a scene where the second substrate 200 is away from the first substrate 100.

Figure 8A:
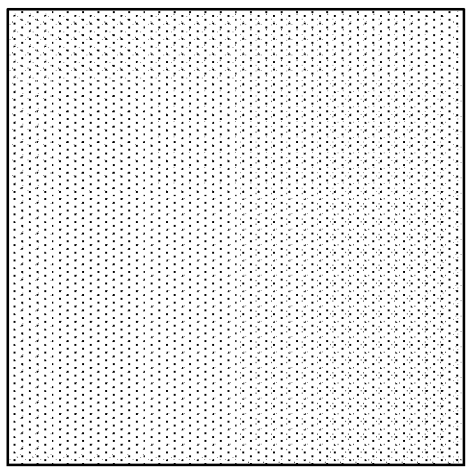
FIGS. 8a-8f are schematic diagrams of a structure of a pixel electrode according to an exemplary embodiment of the present disclosure.
Figure 8B:
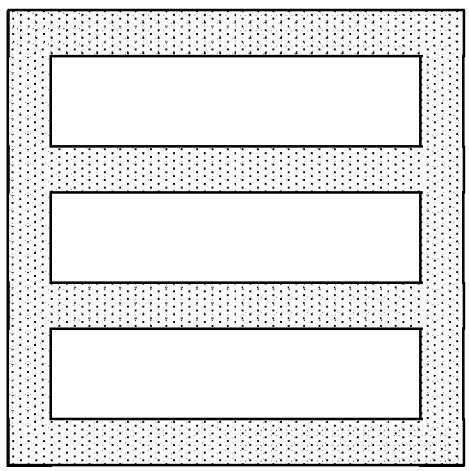
Figure 8C:
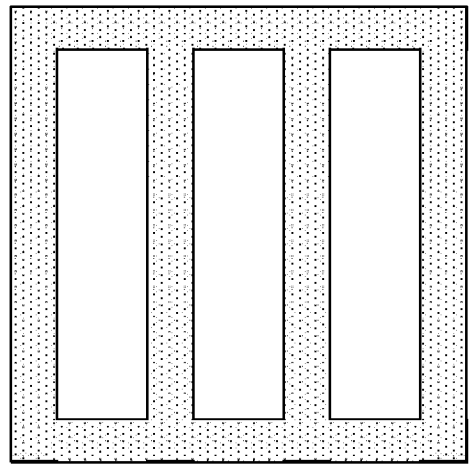
Figure 8D:
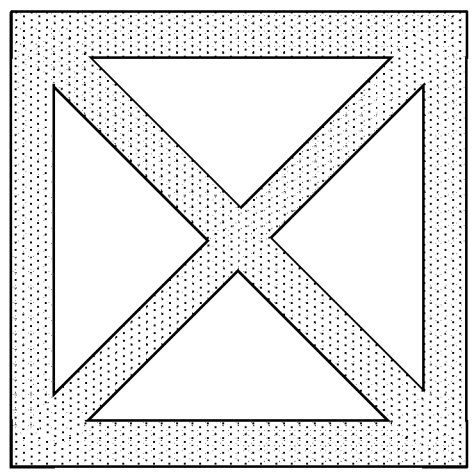
Figure 8E:
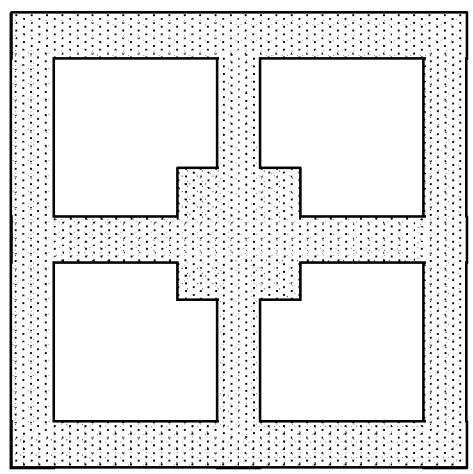
Figure 8F:
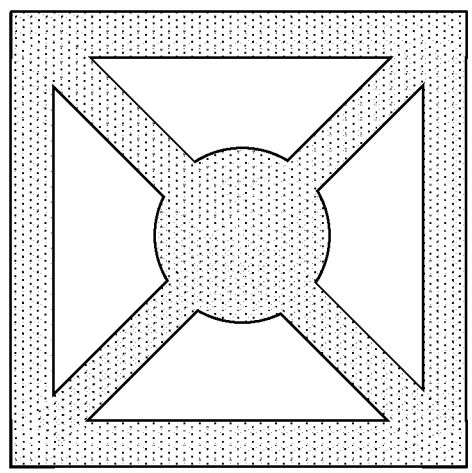

FIGS. 8a-8f are schematic diagrams of a structure of a pixel electrode according to an exemplary embodiment of the present disclosure. In an exemplary embodiment, the pixel electrode 44 may be in a block shape, a strip shape or a grid shape composed of strip shapes. For example, the shape of the pixel electrode 44 may be a rectangular block as shown in FIG. 8a. For another example, the pixel electrode 44 may have a horizontal pane-like shape, and include multiple first electrode strips extending in a first direction. First ends of the multiple first electrode strips are connected by one second electrode strip extending in a second direction, and second ends of the multiple first electrode strips are connected by another second electrode strip extending in the second direction, as shown in FIG. 8b. For another example, the pixel electrode 44 may have a vertical pane-like shape, and include multiple second electrode strips extending in the second direction. First ends of the multiple second electrode strips are connected by one first electrode strip extending in the first direction, and second ends of the multiple second electrode strips are connected by another first electrode strip extending in the first direction, as shown in FIG. 8c. For another example, the shape of the pixel electrode 44 may be composed of multiple first electrode strips and multiple second electrode strips that intersect and/or are connected to each other, as shown in FIG. 8d. For another example, the shape of the pixel electrode 44 may be a grid shape composed of strip shapes and a block shape, as shown in FIGS. 8e and 8f. In an exemplary embodiment, the block shape may be triangular, trapezoidal, pentagonal, hexagonal, circular, or elliptical, and the first and second electrode strips may be linear, zigzagged, or curved, which is not limited in the present disclosure.

In an exemplary embodiment, since an area where the pixel electrode on the first substrate overlaps with the common electrode on the second substrate forms a display area of a displayed image, factors such as a display area, display uniformity and display panel's transmittance need to be considered in size design and shape design of the pixel electrode. In order to achieve better display effect and transparent effect, and achieving a balance between the display effect and the transparent effect, the area of the pixel electrode may be about 30% to 50% of the pixel opening. A pixel opening usually refers to a difference between an area enclosed by gate lines and data lines and an area occupied by thin film transistors. For example, the area of the pixel electrode may be about 40% of the pixel opening. In order to achieve the display uniformity, patterned pixel electrodes may be provided so as to be dispersed as far as possible to a large area of the pixel opening when the display area is fixed. For example, for a grid-shaped pixel electrode, a length of a first electrode strip in the first direction X may be about 50% to 70% of a length of the pixel opening in the first direction X, and a length of a second electrode strip in the second direction Y may be about 50% to 70% of a length of the pixel opening in the second direction Y.

In an exemplary embodiment, with the design of the shielding pattern, light emitted from the first display area on the front side of the display panel does not affect light emitted from the second display area on the back side of the display panel, and the light emitted from the second display area on the back side of the display panel does not affect the light emitted from the first display area on the front side of the display panel, thereby achieving a better effect of double-sided display, and displaying on the two sides do not interfere with each other. For example, for the grid-shaped first and second light-shielding patterns, considering preparation accuracy of the first substrate and the second substrate and deviations existing in the cell alignment process, dimensions of the first light-shielding pattern and the second light-shielding pattern need to satisfy the following conditions:

in the first direction X, width of the first shielding strip≥width of the first electrode strip+2*lithography platform alignment accuracy+cell alignment platform accuracy+safe distance; and in the second direction Y, width of the second shielding strip≥width of the second electrode strip+2*lithography platform alignment accuracy+cell alignment platform accuracy+safe distance.

The safe distance is a parameter related to an overall thickness of the display panel and a viewing angle of the display panel, which may ensure that the light scattered by the liquid crystal is completely shielded by the shielding patterns. In an exemplary embodiment, the safe distance may be about 0.5 μm to 3.0 μm.

A preparation process of the display panel will be exemplarily described below. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a material on a base substrate through a process such as depositing, coating, or the like. If the "thin film" does not need a patterning process in an entire preparation process, the "thin film" may also be called a "layer". If the "thin film" needs a patterning process in the entire preparation process, it is called a "thin film" before the patterning process, and called a "layer" after the patterning process. The "layer" processed by the patterning processes includes at least one "pattern". "A and B being arranged on the same layer" in the present disclosure means that A and B are formed simultaneously through a same patterning process, and the "thickness" of a film layer is dimension of the film layer in a direction perpendicular to the display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a boundary range of the orthographic projection of A, or the boundary of the orthographic projection of A overlaps with the boundary of the orthographic projection of B.

In an exemplary embodiment, the preparation process of the display panel may include two portions, the first portion includes substrate preparation, and the second portion includes alignment pressing (cell alignment). In an exemplary embodiment, the substrate preparation includes preparation of a first substrate and preparation of a second substrate, which have no requirement on orders and can be carried out simultaneously. In an exemplary embodiment, the first substrate may be an array substrate and the second substrate may be an opposite substrate. The following describes the processing operations of the two portions respectively.

Figure 9:
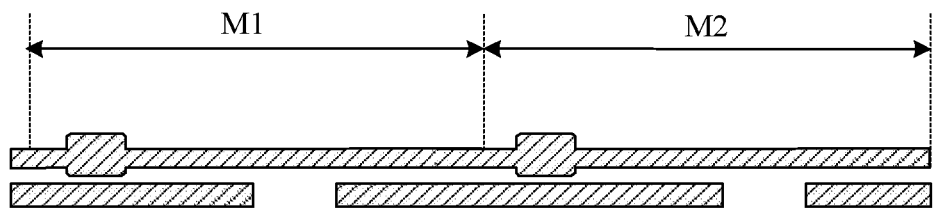
FIG. 9 is a schematic diagram after a pattern of a first conductive layer is formed according to an exemplary embodiment of the present disclosure.
Figure 9:
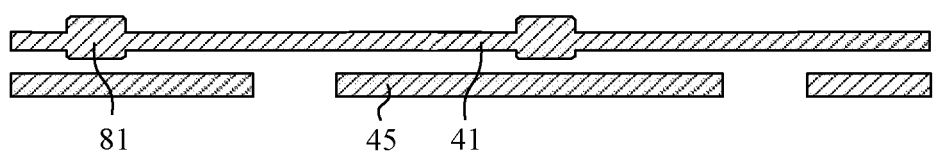

I. Taking one first array sub-area M1 and one second array sub-area M2 as examples, the preparation of the first substrate in the first portion may include:

(1) Forming a pattern of a first conductive layer. In an exemplary embodiment, forming the pattern of the first conductive layer may include: depositing a first metal thin film on a first base substrate, and patterning the first metal thin film by a patterning process, to form the pattern of the first conductive layer on the first base substrate, wherein the pattern of the first conductive layer includes at least a gate line 41, a first common electrode line 45, and a gate electrode 81 provided in each sub-area, as shown in FIG. 9. In an exemplary embodiment, the gate electrode 81 and the gate line 41 may be interconnected as an integral structure, and the first common electrode line 45 may be parallel to the gate line 41 and may include first sub-line segments and second sub-line segments provided at intervals.

Figure 10:
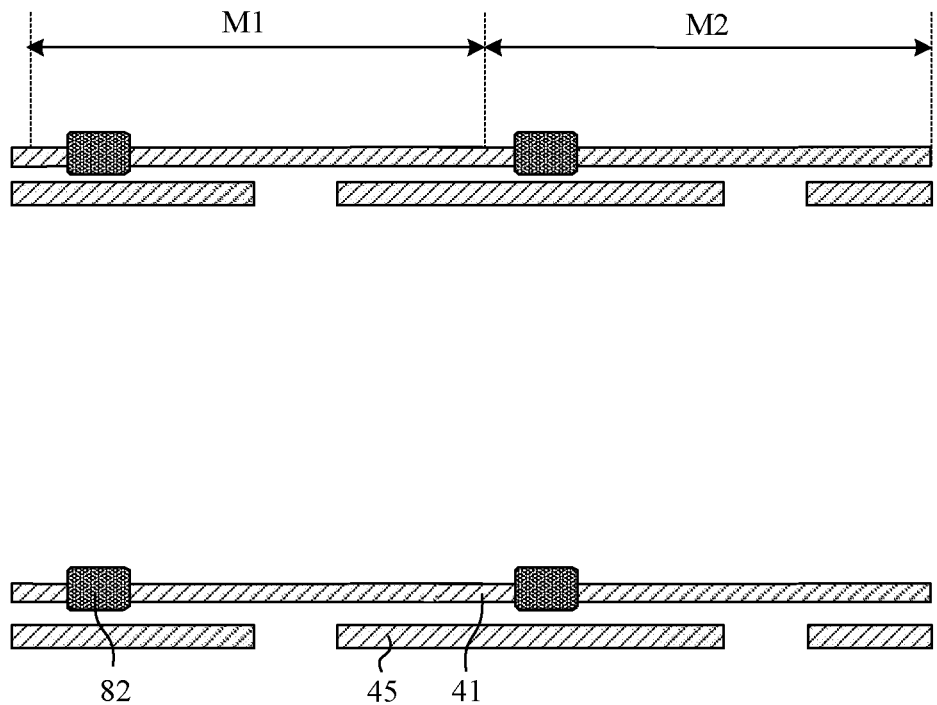
FIG. 10 is a schematic diagram after a pattern of a semiconductor layer is formed according to an exemplary embodiment of the present disclosure.

(2) Forming a pattern of a semiconductor layer. In an exemplary embodiment, forming the pattern of the semiconductor layer may include: sequentially depositing a first insulating thin film and a semiconductor layer thin film on the first base substrate on which the aforementioned pattern is formed, and patterning the semiconductor layer thin film by a patterning process, to form a first insulating layer covering the pattern of the first metal layer and the pattern of the semiconductor layer provided on the first insulating layer, wherein the pattern of the semiconductor layer includes at least an active layer 82 provided in each sub-area, and a position of the active layer 82 corresponds to a position of the gate electrode 81 in the sub-pixel where it is located, as shown in FIG. 10.

Figure 11:
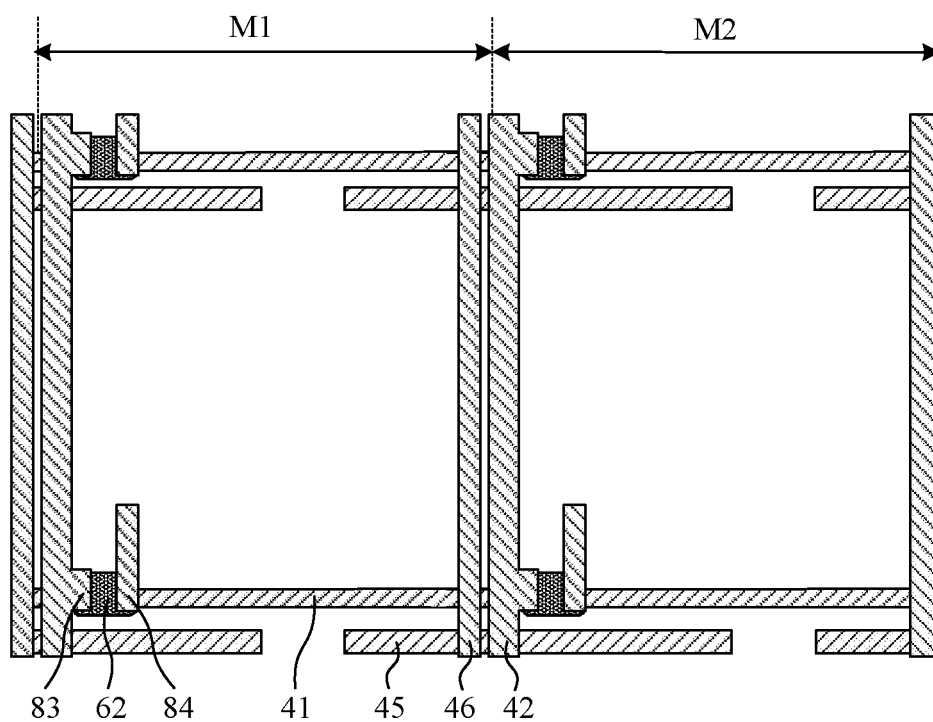
FIG. 11 is a schematic diagram after a pattern of a second conductive layer is formed according to an exemplary embodiment of the present disclosure.

(3) Forming patterns of a second insulating layer and a second conductive layer. In an exemplary embodiment, forming the pattern of the second insulating layer may include: depositing a second insulating thin film on the first base substrate on which the aforementioned patterns are formed, and patterning the second insulating thin film by a patterning process, to form a second insulating layer covering the pattern of the semiconductor layer, wherein the second insulating layer is provided with a via hole which exposes surfaces of two ends of the active layer. In an exemplary embodiment, forming the pattern of the second conductive layer may include: depositing a second metal thin film on the first base substrate on which the aforementioned patterns are formed, and patterning the second metal thin film by a patterning process, to form the pattern of the second conductive layer, wherein the pattern of the second conductive layer includes at least a data line 42, a second common electrode line 46, and a source electrode 83 and a drain electrode 84 provided in each sub-area. The source electrode 83 and the drain electrode 84 are respectively connected to the active layer through via holes, as shown in FIG. 11. In an exemplary embodiment, the second common electrode line 46 is parallel to the data line 42, the source electrode 83 and the data line 42 are interconnected as an integral structure, a conductive channel is formed between the source electrode 83 and the drain electrode 84, and the gate electrode 81, the active layer 82, the source electrode 83 and the drain electrode 84 constitute a thin film transistor.

Figure 12:
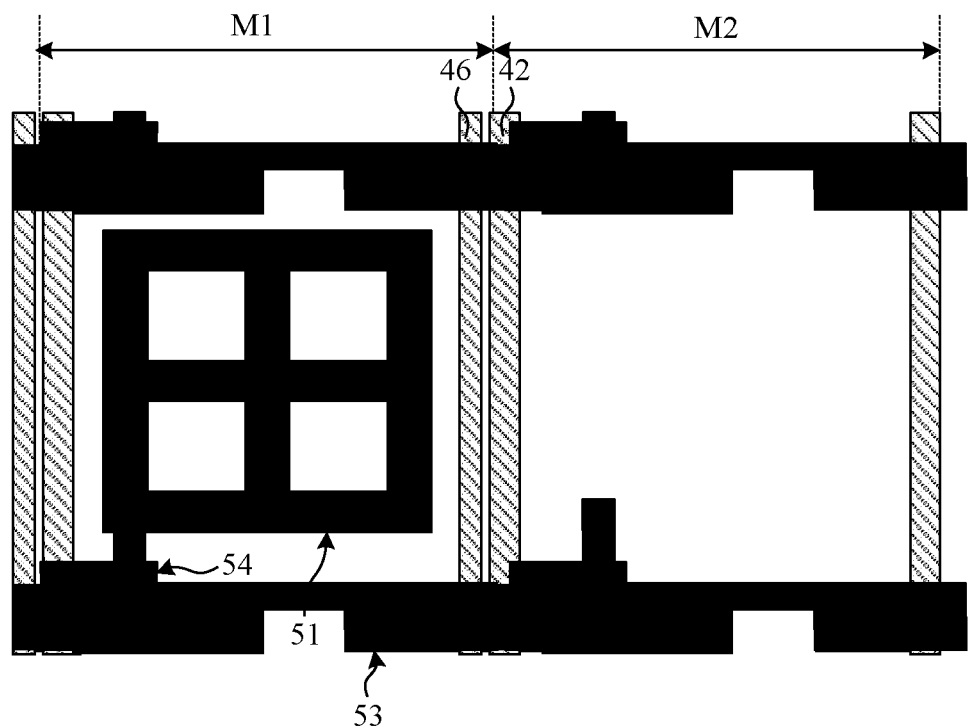
FIG. 12 is a schematic diagram after a first shielding pattern is formed according to an exemplary embodiment of the present disclosure.

(4) Forming a first shielding pattern. In an exemplary embodiment, forming the first shielding pattern may include: sequentially depositing a third insulating thin film and a shielding thin film on the first base substrate on which the aforementioned patterns are formed, and patterning the shielding thin film by a patterning process, to form a third insulating layer covering the pattern of the second conductive layer, and a shielding pattern provided on the third insulating layer, wherein the shielding pattern at least includes a first shielding pattern 51, a shielding strip 53 and a shielding block 54, as shown in FIG. 12.

In an exemplary embodiment, the first shielding pattern 51 is provided in the first array sub-area M1, and position and shape of the first shielding pattern 51 correspond to position and shape of a pixel electrode to be formed in the first array sub-area M1 subsequently.

In an exemplary embodiment, the shielding strip 53 and the shielding block 54 are provided in each sub-area, wherein shape and position of the shielding strip 53 may correspond to shapes and positions of the gate line 41 and the first common electrode line 45, and an orthographic projection of the shielding strip 53 on the first base substrate includes an orthographic projection of the gate line 41 and the first common electrode line 45 on the first base substrate. A position of the shielding block 54 corresponds to a position of the thin film transistor, and an orthographic projection of the shielding block 54 on the first base substrate includes an orthographic projection of the thin film transistor on the first base substrate. In an exemplary embodiment, the shielding strip 53 and the shielding block 54 may be interconnected an integral structure.

Figure 13:
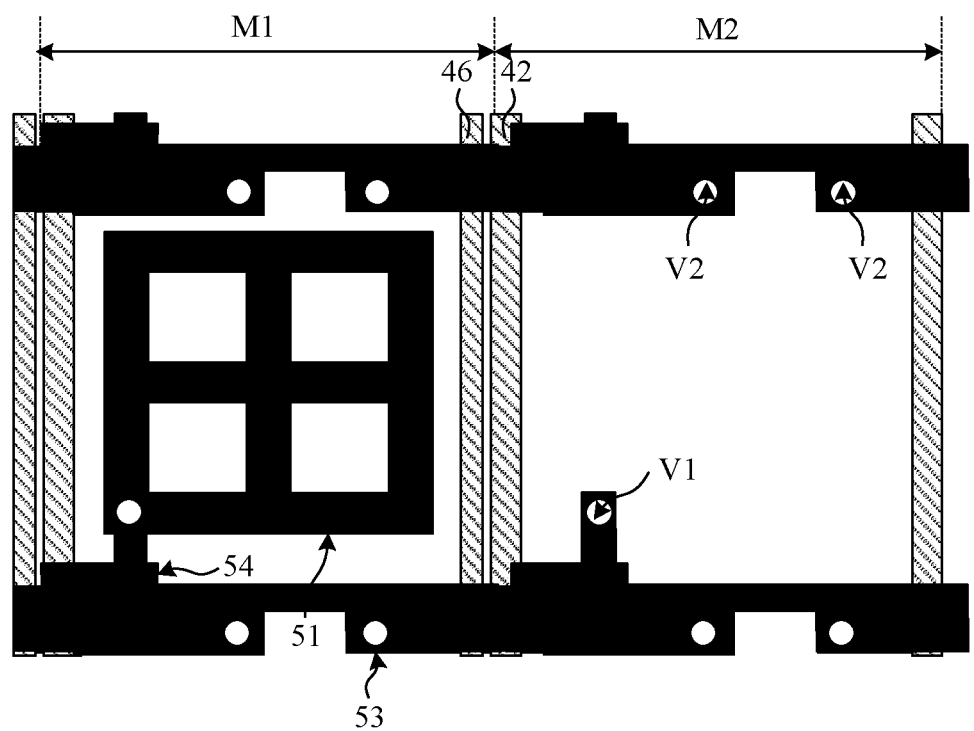
FIG. 13 is a schematic diagram after a pattern of a third insulating layer is formed according to an exemplary embodiment of the present disclosure.

(5) Forming a pattern of a fourth insulating layer. In an exemplary embodiment, forming the pattern of the fourth insulating layer may include: depositing a fourth insulating thin film on the first base substrate on which the aforementioned patterns are formed, and patterning the fourth insulating thin film by a patterning process, to form a fourth insulating layer covering the shielding pattern, wherein multiple via holes are provided on the fourth insulating layer, as shown in FIG. 13. In an exemplary embodiment, the multiple via holes include at least a first via hole V1 exposing a drain electrode, and second via holes V2 exposing a first sub-line segment and a second sub-line segment, respectively.

Figure 14:
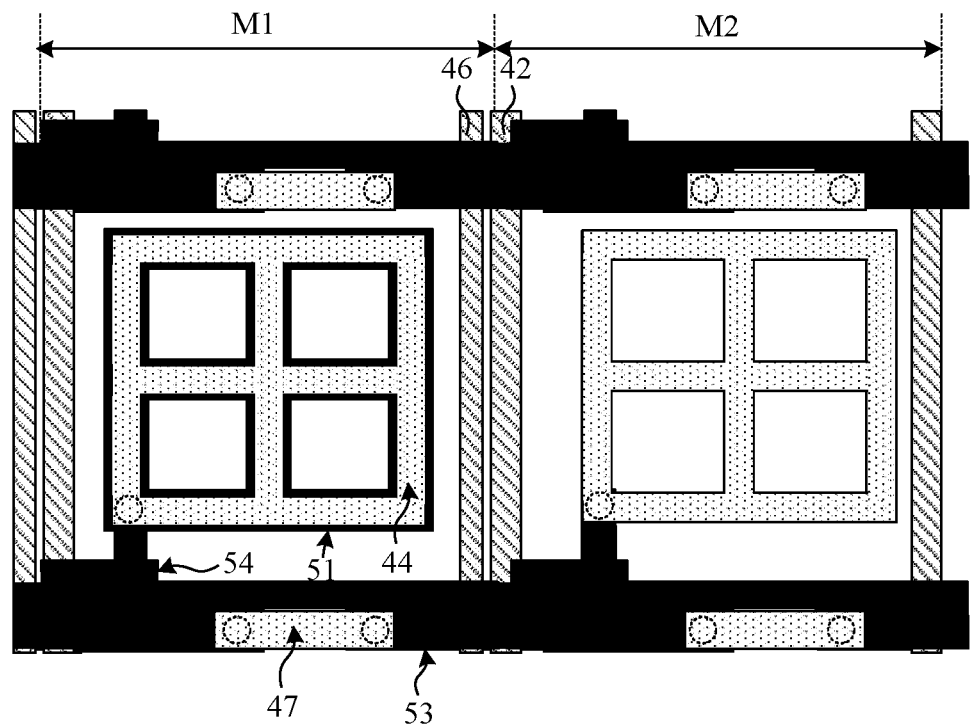
FIG. 14 is a schematic diagram after a pattern of a pixel electrode is formed according to an exemplary embodiment of the present disclosure.

(6) Forming a pattern of a pixel electrode. In an exemplary implementation, forming the pattern of the pixel electrode may include: depositing a transparent conductive thin film on the first base substrate on which the aforementioned patterns are formed, and patterning the transparent conductive thin film by a patterning process, to form a pattern of a transparent conductive layer on the third insulating layer, wherein the pattern of the transparent conductive layer at least includes a pixel electrode 44 and a connection line segment 47 provided in each sub-area, as shown in FIG. 14. In an exemplary embodiment, the pixel electrode 44 is connected to the drain electrode through the first via hole V1, and the connection line segment 47 is connected to the first sub-line segment and the second sub-line segment respectively through a second via hole V2.

In an exemplary embodiment, in the first array sub-area M1, an orthographic projection of the pixel electrode 44 on the first base substrate may be within a range of an orthographic projection of the first shielding pattern 51 on the first base substrate.

Subsequent preparation processes may include the formation of an alignment film and processing such as friction alignment or light alignment of the alignment film, which will not be described here.

Thus, the preparation of the first substrate is completed. In an exemplary embodiment, the first base substrate may be a glass base substrate, a quartz base substrate, or a plastic base substrate. The first metal thin film and the second metal thin film may be made of a metal material and deposited by a magnetron sputtering method (Sputter). The metal material may include any one or more of silver (Ag), copper (Cu), aluminum (Al), titanium (Ti), and molybdenum (Mo), or an alloy material of the above metals, such as aluminum neodymium alloy (AlNd) or molybdenum niobium alloy (MoNb), and may be in a single-layer structure or multi-layer composite structure, such as Ti/Al/Ti. The first insulating thin film, the second insulating thin film and the third insulating thin film may be made of any one or more of silicon oxide (SiOx), silicon nitride (SiNx) and silicon oxynitride (SiON), and may be in a single-layer structure or a multi-layer composite structure, which is deposited by chemical vapor deposition (CVD) method or plasma-enhanced chemical vapor deposition (PECVD) method. The first insulating layer is referred to as a gate insulating (GI) layer, and the second insulating layer is referred to as a passivation (PVX) layer. The fourth insulating film may be made of an organic material and is referred to as a planarization layer. The light shielding thin film may be made of an opaque metal or a nonmetal material, and its thickness may be about 1 μm to 2 μm. The transparent conductive thin film may be made of indium tin oxide (ITO) or indium zinc oxide (IZO). The semiconductor layer thin film may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene. That is, the embodiment of the present disclosure is applicable to transistors that are manufactured based on oxide technology, silicon technology or organic technology.

Figure 15:
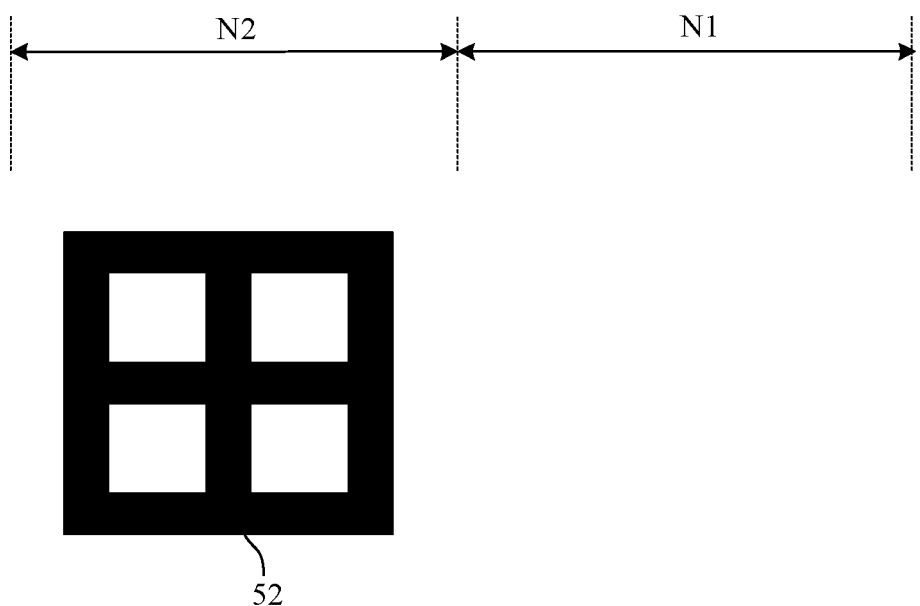
FIG. 15 is a schematic diagram after a second shielding pattern is formed according to an exemplary embodiment of the present disclosure.

II. Taking one first opposite sub-area N1 and one second opposite sub-area N2 as examples, the preparation of the second substrate in the first portion may include:

(1) Forming a second shielding pattern. In an exemplary embodiment, forming the second shielding pattern may include: depositing or coating a shielding thin film on a second base substrate, and patterning the shielding thin film by a patterning process, to form a shielding pattern on the second base substrate, wherein the shielding pattern includes at least a second shielding pattern 52, as shown in FIG. 15.

In an exemplary embodiment, the second shielding pattern 52 is provided in the second opposite sub-area N2, and position and shape of the second shielding pattern 52 correspond to position and shape of a pixel electrode formed in the second array sub-area M2 in the first substrate.

Figure 16:
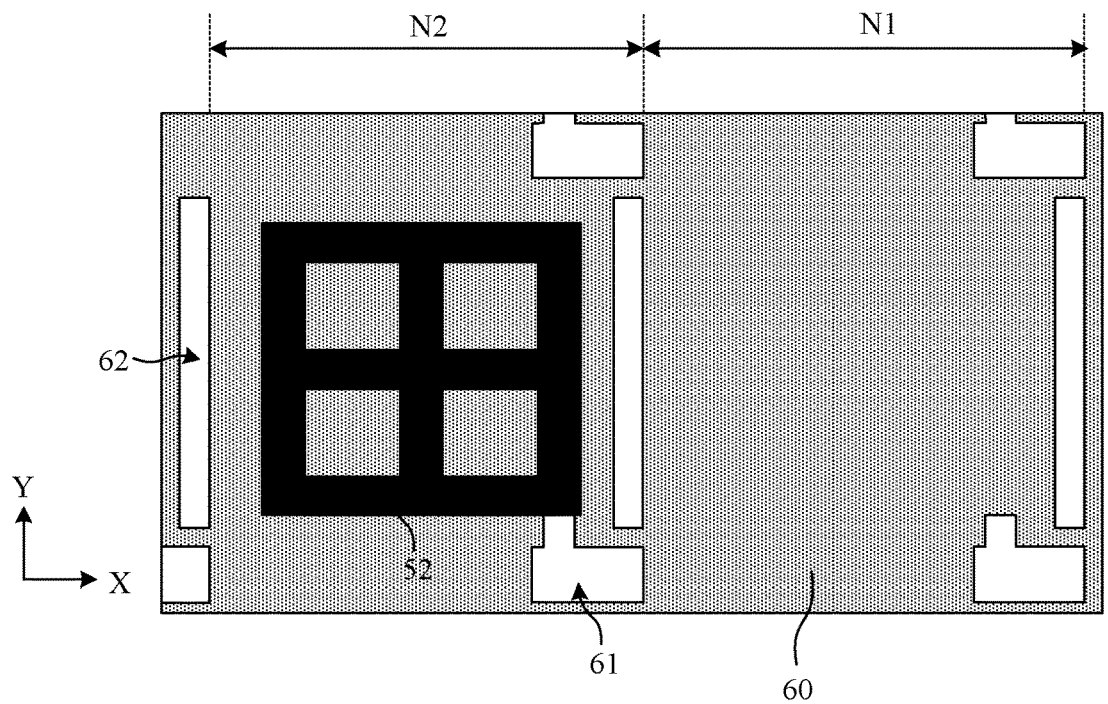
FIG. 16 is a schematic diagram after a pattern of a common electrode is formed according to an exemplary embodiment of the present disclosure.

(2) Forming a pattern of a common electrode. In an exemplary embodiment, forming the pattern of the common electrode may include: sequentially depositing a first protective thin film and a transparent conductive thin film on the first substrate on which the aforementioned patterns are formed, and patterning the transparent conductive thin film by a patterning process, to form a first protective layer covering the second shielding pattern, and a pattern of a transparent conductive layer provided on the first protective layer, wherein the pattern of the transparent conductive layer includes at least a common electrode 60, as shown in FIG. 16.

In an exemplary embodiment, the common electrode 60 in each sub-area has a whole-surface structure, multiple openings may be provided on the common electrode 60, and the multiple openings may include at least a first opening 61 and a second opening 62. Position and shape of the first opening 61 may correspond to the position and shape of the thin film transistor on the first substrate, position and shape of the second opening 62 may correspond to the position and shape of the data line on the first substrate, and the first opening 61 and the second opening 62 are configured to reduce the parasitic capacitance between the common electrode on the second substrate and the data line and the thin film transistor on the first substrate, so as to reduce load of the display panel.

Subsequent preparation processes may include formation of a post spacer (PS), an alignment film, and the processing of friction alignment or light alignment of the alignment film, which will not be described here.

Thus, the preparation of the second substrate is completed. In an exemplary embodiment, the second substrate may be a glass substrate, a quartz substrate, or a plastic substrate. The first protective thin film may be made of an organic material, and the transparent conductive thin film may be made of indium tin oxide (ITO) or indium zinc oxide (IZO), and has a thickness of about 40 nm to 200 nm. The light shielding thin film may be made of an opaque metal or a nonmetal material, and its thickness may be about 1 μm to 2 μm.

III. Portion II

In an exemplary embodiment, the cell alignment process may include:
(1) Turning over the second substrate so that the common electrode on the second substrate faces the pixel electrode of the first substrate; and
(2) Coating a frame sealing glue on a non-display area of the first substrate, dropping a liquid crystal mixture on a display area of the first substrate, aligning and pressing the first substrate and the second substrate relatively close under a vacuum condition, and curing the frame sealing glue through ultraviolet curing and/or thermal curing to form a liquid crystal cell.

In an exemplary embodiment, the liquid crystal mixture may include at least three portions, which are respectively: one or more liquid crystal molecular materials, one or more photopolymerizable monomer molecular (e.g., vinyl-containing monomers) materials, and one or more photoinitiator materials. In the liquid crystal mixture, a mass fraction ratio of polymerizable monomer material may be about 3% to 9%. The polymerizable monomer may be made of a material with good compatibility with liquid crystal molecule, and the liquid crystal molecular material may be made of a material with large dielectric constant difference.

In an exemplary embodiment, the first substrate may be turned over, and the frame sealing glue and liquid crystal mixture may be coated on the second substrate, which is not limited in the present disclosure.
(3) Irradiating the liquid crystal cell with ultraviolet (UV) light, so that photosensitive liquid crystal molecules in the liquid crystal mixture are polymerized to form a polymer network, and finally a polymer stabilized liquid crystal (PSLC) layer is formed.

In an exemplary embodiment, a, ask may be used for selective UV light irradiation, or a PSLC may be formed by thermal polymerization, infrared polymerization or the like, which is not limited in the present disclosure.

In an exemplary embodiment, a thickness of the liquid crystal cell may be about 2 μm to 10 μm. For example, the thickness of the liquid crystal cell may be about 2 μm to 6 μm.

Figure 17:
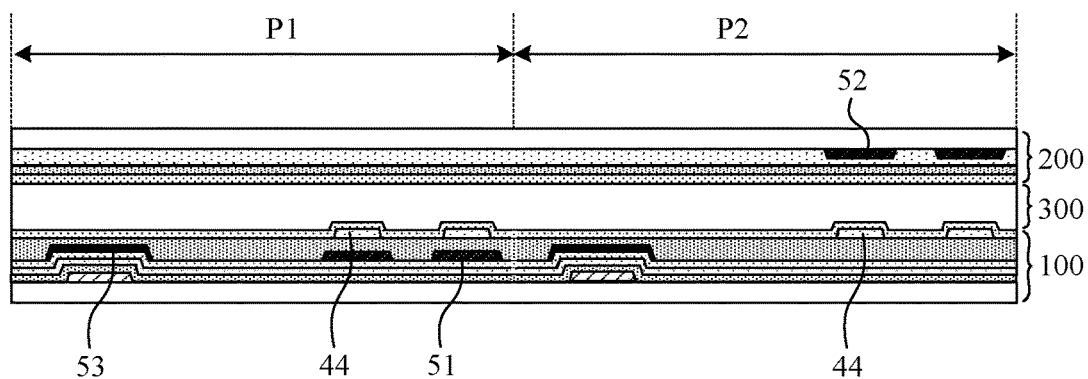
FIG. 17 is a schematic diagram after a display panel is formed by cell-aligning according to an exemplary embodiment of the present disclosure.

So far, a display panel is formed, as shown in FIG. 17.

As can be seen from the aforementioned structure and preparation process of the display panel, by providing a light shielding pattern on a first substrate and a second substrate respectively and designing sub-pixels for front display and back display separately, the exemplary embodiments of the present disclosure not only implement double-sided transparent display under the condition of keeping high transparency, but also avoid the light leakage problem caused by preparation and alignment deviation, and reduce the crosstalk problem of double-sided display. By employing a polymer stabilized liquid crystal in the exemplary embodiment of the present, the display panel exhibits a transparent state when it is not powered, and the display panel has higher transparency and response speed, thereby greatly reducing the power consumption of the display panel. By use of a field sequence mode to achieve color display in the exemplary embodiment of the present disclosure, only one sub-pixel is needed to present a desired color, thus maximizing display resolution and improving display quality. The display panel according to the exemplary embodiment of the present disclosure has better display quality and higher transmittance while implementing double-sided transparent display. The preparation process according to the exemplary embodiment of the present disclosure may be achieved by using mature preparation equipment, with little process improvement, high compatibility, simple process realization, easy implementation, high production efficiency, low production cost, and high yield rate.

Figure 18:
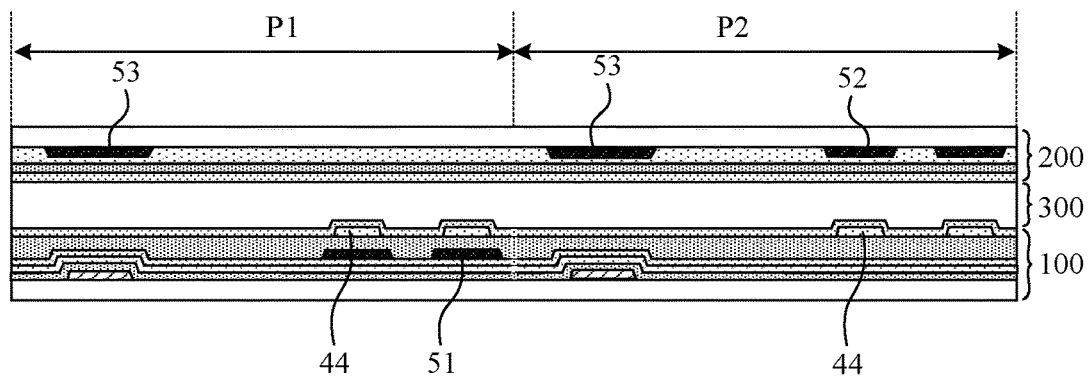
FIG. 18 is a schematic diagram of a cross-sectional structure of another display panel according to an exemplary embodiment of the present disclosure.

FIG. 18 is a schematic diagram of a cross-sectional structure of another display panel according to an exemplary embodiment of the present disclosure, illustrating structures of a first sub-pixel P1 and a second sub-pixel P2. The main structure of the display panel in this exemplary embodiment is substantially similar to that of the previous embodiments, which includes a first substrate 100 and a second substrate 200 provided opposite each other, and a polymer-stabilized liquid crystal layer 300 provided between the first substrate 100 and the second substrate 200. The difference lies in that the shielding strip 53 is provided on the second substrate 200.

In an exemplary embodiment, the shielding strip 53 may be provided in a same layer as the second shielding pattern 52, and formed simultaneously by the same patterning process, the shape and position of the shielding strip 53 may correspond to the shape and position of the gate line and/or the data line, and an orthographic projection of the gate line and/or the data line on the display panel plane may be within a range of an orthographic projection of the shielding strip 53 on the display panel plane.

In an exemplary embodiment, corresponding extensions may be made on the basis of the solutions of the foregoing exemplary embodiments of the present disclosure. For example, the shielding strip 53 of the first sub-pixel P1 is provided on the second substrate 200, and the shielding strip 53 of the second sub-pixel P2 is provided on the first substrate 100. For another example, the shielding strip 53 is provided on the first substrate 100 and the second substrate 200 simultaneously. For another example, the common electrode on the second substrate 200 may have a patterned structure, and the pattern of the common electrode is the same as the pattern of the corresponding pixel electrode. For another example, the pixel electrodes in the first sub-pixel P1 and the second sub-pixel P2 may have different shapes, and the common electrodes in the first sub-pixel P1 and the second sub-pixel P2 may have different shapes, which is not limited in the present disclosure.

An embodiment of the present disclosure further provides a method for preparing a display panel, which may include:
preparing a first substrate and a second substrate, wherein the first substrate includes multiple sub-pixels defined by intersection of multiple gate lines and multiple data lines, and each of the multiple sub-pixels includes a thin film transistor and a pixel electrode; the multiple sub-pixels include at least one first sub-pixel that emits light from a side of the second substrate away from the first substrate and at least one second sub-pixel that emits light from a side of the first substrate away from the second substrate; the first substrate in a first sub-pixel is provided with a first shielding pattern, and an orthographic projection of the pixel electrode in the first sub-pixel on a plane of the display panel is within a range of an orthographic projection of the first shielding pattern on the first substrate; the second substrate in a second sub-pixel is provided with a second shielding pattern, and an orthographic projection of the pixel electrode in the second sub-pixel on the plane of the display panel is within a range of an orthographic projection of the second shielding pattern on the second substrate; and cell aligning the first substrate and the second substrate, wherein a polymer-stabilized liquid crystal layer is provided between the first substrate and the second substrate.

An embodiment of the present disclosure further provides a display device, including the aforementioned display panel. The display device may be any product or component with a display function such as a mobile phone, a tablet computer, a television, a display, a laptop computer, a digital photo frame, a navigator, etc.

Although the embodiments disclosed in the present disclosure are as above, the described contents are only embodiments used for convenience of understanding the present disclosure and are not intended to limit the present disclosure. Those skilled in the art may make any modification and change to the implementation form and details without departing from the essence and scope of the present disclosure. However, the scope of patent protection of the present disclosure should still be subject to the scope defined by the appended claims.

The invention claimed is:

1. A display panel, comprising a first substrate and a second substrate provided opposite each other, and a polymer-stabilized liquid crystal layer provided between the first substrate and the second substrate; wherein the first substrate comprises a plurality of sub-pixels defined by intersection of a plurality of gate lines and a plurality of data lines, and each of the plurality of sub-pixels comprises a thin film transistor and a pixel electrode; the plurality of sub-pixels comprise at least one first sub-pixel that emits light from a side of the second substrate away from the first substrate and at least one second sub-pixel that emits light from a side of the first substrate away from the second substrate; the first substrate in a first sub-pixel is provided with a first shielding pattern, and an orthographic projection of the pixel electrode in the first sub-pixel on a plane of the display panel is within a range of an orthographic projection of the first shielding pattern on the first substrate; the second substrate in a second sub-pixel is provided with a second shielding pattern, and an orthographic projection of the pixel electrode in the second sub-pixel on the plane of the display panel is within a range of an orthographic projection of the second shielding pattern on the second substrate;

wherein a shape of a pixel electrode comprises any one or more of block, strip and grid;

wherein the pixel electrode comprises at least one first electrode strip extending along a first direction and at least one second electrode strip extending along a second direction, the at least one first electrode strip and the at least one second electrode strip intersect with each other to form a grid-shaped pixel electrode, and the second direction intersects with the first direction.

2. The display panel according to claim 1, wherein the first substrate and/or the second substrate are further provided with a shielding strip, and an orthographic projection of the shielding strip on the plane of the display panel at least partially overlaps with an orthographic projection of the gate lines and/or the data lines on the plane of the display panel.

3. The display panel according to claim 1, wherein the first substrate and/or the second substrate are further provided with a shielding strip, and an extension direction of the shielding strip is perpendicular to a light propagation direction in the display panel.

4. The display panel according to claim 1, wherein the first substrate and/or the second substrate are further provided with a shielding block, and an orthographic projection of the shielding block on the plane of the display panel at least partially overlaps with an orthographic projection of the thin film transistor on the display panel plane.

5. The display panel according to claim 1, wherein a common electrode is provided on the second substrate; in the first sub-pixel, there is a first overlapping area between an orthographic projection of the pixel electrode of the first substrate on the plane of the display panel and an orthographic projection of the common electrode of the second substrate on the display panel plane, the first overlapping area forms a first display area in which light is emitted from the side of the second substrate away from the first substrate, and an area other than the first display area forms a first transparent area; in the second sub-pixel, there is a second overlapping area between an orthographic projection of the pixel electrode of the first substrate on the plane of the display panel and an orthographic projection of the common electrode of the second substrate on the plane of the display panel, the second overlapping area forms a second display area in which light is emitted from the side of the first substrate away from the second substrate, and an area other than the second display area forms a second transparent area.

6. The display panel according to claim 5, wherein the common electrode is provided with a first opening and/or a second opening, an orthographic projection of the first opening in the plane of the display panel at least partially overlaps with an orthographic projection of the thin film transistor on the plane of the display panel, and an orthographic projection of the second opening on the plane of the display panel at least partially overlaps with an orthographic projection of the gate lines and/or the data lines on the plane of the display panel.

7. The display panel according to claim 1, wherein an area of the pixel electrode is 30% to 50% of an area of a pixel opening of the sub-pixel.

8. The display panel according to claim 1, wherein a length of a first electrode strip in the first direction is 50% to 70% of a length of the pixel opening in the first direction, and/or a length of a second electrode strip in the second direction is 50% to 70% of a length of the pixel opening in the second direction.

9. The display panel according to claim 1, wherein the first shielding pattern and the second shielding pattern comprise at least one first shielding strip extending along the first direction and at least one second shielding strip extending along the second direction, the first shielding strip and the second shielding strip intersect with each other to form a grid shape; a width of a first shielding strip in the first direction is greater than a width of a first electrode strip in the first direction, and an orthographic projection of the first electrode strip on the plane of the display panel is within a range of an orthographic projection of the first shielding strip on the plane of the display panel; a width of a second shielding strip in the second direction is greater than a width of a second electrode strip in the second direction, and an orthographic projection of the second electrode strip on the plane of the display panel is within a range of an orthographic projection of the second shielding strip on the plane of the display panel.

10. The display panel according to claim 9, wherein in the first direction, the width of the first shielding strip≥the width of the first electrode strip+2* lithography platform alignment accuracy+cell alignment platform accuracy+safe distance; and in the second direction, the width of the second shielding strip≥the width of the second electrode strip+2* lithography platform alignment accuracy+cell alignment platform accuracy+safe distance.

11. The display panel according to claim 1, wherein the first substrate comprises: a first base substrate, an array structural layer provided on a side of the first base substrate close to a second base substrate, a first shielding pattern provided on a side of the array structural layer close to the second base substrate, an insulating layer provided on a side of the first shielding pattern close to the second base substrate, and a pixel electrode provided on a side of the insulating layer close to the second base substrate, wherein the first shielding pattern is provided on a first sub-pixel; the second substrate comprises: a second base substrate, a second shielding pattern provided on a side of the second base substrate close to the first base substrate, a protective layer provided on a side of the second shielding pattern close to the first base substrate, and a common electrode provided on a side of the protective layer close to the first base substrate, wherein the second shielding pattern is provided on a second sub-pixel.

12. The display panel according to claim 1, wherein the display panel further comprises a light source device, wherein the light source device is provided on the side of the first substrate away from the second substrate, or the light source device is provided on the side of the second substrate away from the first substrate, or the light source device is provided on a side surface of the first substrate, or the light source device is provided on a side surface of the second substrate.

13. The display panel according to claim 12, wherein the light source device comprise a first light source emitting light of a first color, a second light source emitting light of a second color, and a third light source emitting light of a third color, and the light of the first color, the light of the second color, and the light of the third color are periodically emitted in sequence.

14. The display panel according to claim 13, wherein the light source device further comprises a light guide plate, wherein the light guide plate is provided on the side of the first substrate away from the second substrate, or the light guide plate is provided on the side of the second substrate away from the first substrate; and the first light source, the second light source and the third light source are provided on a side surface of the light guide plate.

15. A display device, comprising the display panel according to claim 1.

16. A method for preparing a display panel, comprising:
preparing a first substrate and a second substrate; wherein the first substrate comprises a plurality of sub-pixels defined by intersection of a plurality of gate lines and a plurality of data lines, and each of the plurality of sub-pixels comprises a thin film transistor and a pixel electrode; the plurality of sub-pixels comprise at least one first sub-pixel that emits light from a side of the second substrate away from the first substrate and at least one second sub-pixel that emits light from a side of the first substrate away from the second substrate; the first substrate in a first sub-pixel is provided with a first shielding pattern, and an orthographic projection of the pixel electrode in the first sub-pixel on a plane of the display panel is within a range of an orthographic projection of the first shielding pattern on the first substrate; the second substrate in a second sub-pixel is provided with a second shielding pattern, and an orthographic projection of the pixel electrode in the second sub-pixel on the plane of the display panel is within a range of an orthographic projection of the second shielding pattern on the second substrate; and
cell aligning the first substrate and the second substrate, wherein a polymer-stabilized liquid crystal layer is provided between the first substrate and the second substrate;
wherein a shape of a pixel electrode comprises any one or more of block, strip and grid;
wherein the pixel electrode comprises at least one first electrode strip extending along a first direction and at least one second electrode strip extending along a second direction, the at least one first electrode strip and the at least one second electrode strip intersect with each other to form a grid-shaped pixel electrode, and the second direction intersects with the first direction.

* * * * *